United States Patent
Tong

(12) United States Patent (10) Patent No.: US 6,563,133 B1
Tong (45) Date of Patent: May 13, 2003

(54) METHOD OF EPITAXIAL-LIKE WAFER BONDING AT LOW TEMPERATURE AND BONDED STRUCTURE

(75) Inventor: Qin-Yi Tong, Durham, NC (US)

(73) Assignee: Ziptronix, Inc., Research Triangle Park, NC (US)

(*) Notice: Subject to any disclaimer, the term of this patent is extended or adjusted under 35 U.S.C. 154(b) by 0 days.

(21) Appl. No.: 09/635,272

(22) Filed: Aug. 9, 2000

(51) Int. Cl.$^7$ .......................... H01L 29/04; H01L 21/30
(52) U.S. Cl. ..................... 257/52; 257/347; 257/618; 438/455; 438/974; 438/482; 438/485
(58) Field of Search ................................. 438/455–459, 438/974, 514, 482, 485; 257/52, 646, 347, 49, 629, 618

(56) References Cited

U.S. PATENT DOCUMENTS

| | | | | |
|---|---|---|---|---|
| 4,963,505 | A | * 10/1990 | Fujii et al. ................... | 438/405 |
| 5,354,695 | A | 10/1994 | Leedy ......................... | 438/411 |
| 5,783,477 | A | * 7/1998 | Kish, Jr. et al. ............ | 438/455 |
| 5,877,070 | A | 3/1999 | Goesele et al. ............. | 438/458 |
| 5,915,167 | A | 6/1999 | Leedy ......................... | 438/108 |
| 6,120,917 | A | * 9/2000 | Eda ............................ | 428/692 |
| 6,143,628 | A | * 11/2000 | Sato et al. .................. | 438/455 |
| 6,153,445 | A | * 11/2000 | Yamazaki et al. .......... | 438/158 |
| 6,198,159 | B1 | * 3/2001 | Hosoma et al. ............. | 257/643 |
| 6,246,068 | B1 | 6/2001 | Sato et al. | |
| 6,255,731 | B1 | 7/2001 | Ohmi et al. | |

OTHER PUBLICATIONS

G.L.Sun, et al., Journal de Physique, vol. 49, No. 9, pp. C4–79–C4–82, "Cool Plasma Activated Surface in Silicon Wafer Direct Bonding Technology", Sep. 1988.

Q. Y. Tong, et al., Appl. Phys. Lett., vol. 64, No. 5, pp. 625–627, "Hydrophobic Silicon Wafer Bonding", Jan. 31, 1994.

U. Goesele, et al., Appl. Phys. Lett., vol. 67, No. 24, pp. 3614–3616, "Self–Propagating Room–Temperature Silicon Wafer Bonding in Ultrahigh Vacuum", Dec. 11, 1995.

H. Takagi, et al., Appl. Phys. Lett, vol. 68, No. 16, pp. 2222–2224, "Surface Activated Bonding of Silicon Wafers at Room Temperature", Apr. 15, 1996.

H. Takagi, et al., Jpn. J. Appl. Phys. vol. 38, Part 1, pp. 1589–1594, "Transmission Electron Microscope Observations of the Si/Si Interface Bonded at Room Temperature by Ar Beam Surface Activation", Mar. 1999.

K. D. Hobart, et al., Applied Physics Letters, vol. 72, No. 9, pp. 1095–1097, "Characterization of Si pn Junctions Fabricated by Direct Wafer Bonding in Ultra–High Vacuum", Mar. 2, 1998.

(List continued on next page.)

*Primary Examiner*—Eddie Lee
*Assistant Examiner*—José R. Díaz
(74) *Attorney, Agent, or Firm*—Oblon, Spivak, McClelland, Maier & Neustadt, P.C.

(57) ABSTRACT

A process for bonding oxide-free silicon substrate pairs and other substrates at low temperature. This process involves modifying the surface of the silicon wafers to create defect regions, for example by plasma-treating the surface to be bonded with a or boron-containing plasmas such as a $B_2H_6$ plasma. The surface defect regions may also be created by ion implantation, preferably using boron. The surfaces may also be amorphized. The treated surfaces are placed together, thus forming an attached pair at room temperature in ambient air. The bonding energy reaches approximately 400 mJ/M$^2$ at room temperature, 900 mJ/M$^2$ at 150° C., and 1800 mJ/M$^2$ at 250° C. The bulk silicon fracture energy of 2500 mJ/m$^2$ was achieved after annealing at 350–400° C. The release of hydrogen from B—H complexes and the subsequent absorption of the hydrogen by the plasma induced modified layers on the bonding surfaces at low temperature is most likely responsible for the enhanced bonding energy.

60 Claims, 11 Drawing Sheets

OTHER PUBLICATIONS

T. Akatsu, et al., Journal of Applied Physics, vol. 86, No. 12, pp. 7146–7150, "GaAs Wafer Bonding by Atomic Hydrogen Surface Cleaning", Dec. 15, 1999.

H. Kim, et al., Appl. Phys. Lett., vol. 69, No. 25, pp. 3869–3871, Effects of B Doping on Hydrogen Desorption From Si(001) During Gas–Source Molecular–Beam Epitaxy from $Si_2H_6$ and $B_2H_6$, Dec. 16, 1996.

G. Hess, et al., Appl. Phys. Lett., vol. 71, No. 15, pp. 2184–2186, "Evolution of Subsurface Hydrogen From Boron–Doped Si(100)", Oct. 13, 1997.

F. J. Kub, et al., The 1999 Joint International Meeting, vol. 99–2, Abstract No. 1031, 2 pages, "A Double–Side IGBT by Low Temperature Wafer Bonding", Oct. 17–22, 1999.

A. Ploessl, et al., Mat. Res. Soc. Symp. Proc., vol. 483, pp. 141–146, "Covalent Silicon Bonding at Room Temperature in Ultrahigh Vacuum", 1998.

S. N. Farrens, et al., J. Electrochem. Soc., vol. 142, No. 11, pp. 3949–3955, "Chemical Free Room Temperature Wafer to Wafer Direct Bonding", Nov. 1995.

H. Nakanishi, et al., Proc. the $11^{th}$ Ann. Intl. Workshop on MicroElectroMechanical System, IEEE CH36176, pp. 609–614, "Studies on SiO2—SiO2 Bonding with Hydrofluoric Acid—Room Temperature and Low Stress Bonding Technique for MEMS", 1998.

P. Amirfeiz, et al., The 1999 Joint International Meeting, vol. 99–2, Abstract 963, 2 pages, "Formation of Silicon Structures by Plasma Activated Wafer Bonding", Oct. 17–22, 1999.

S. Bengtsson, et al., International Conference on Complaint & Alternative Substrate Technology, p. 10, "Low Temperature Wafer Bonding", Sep. 1999.

S. Farrens, Electrochemical Society Proceedings, vol. 97–36, pp. 425–436, "Low Temperature Wafer Bonding", 1997.

B.E. Roberds, et al., Electromechanical Society Proceedings, vol. 97–36, pp. 598–606, "Low Temperature, In Situ, Plasma Activated Wafer Bonding", 1997.

B. E. Roberds, et al., Electromechanical Society Proceedings, vol. 97–36, pp. 592–597, "Wafer Bonding of GaAs, InP, and Si Annealed Without Hydrogen for Advanced Device Technologies", 1997.

S. Fujino, et al., Jpn. J. Appl. Phys., vol. 34, Part 2, No. 10B, 1 page, "Silicon Wafer Direct Bonding Through the Amorphous Layer", Oct. 15, 1995 (Abstract Only).

L. Rayleigh, Proceedings of the Royal Society of London, Series A—Mathematical and Physical Sciences, vol. 156, pp. 326–349, "A Study of Glass Surfaces in Optical Contact", Sep. 1, 1936.

M.K. Weldon, et al., Proceedings of the Fourth International Symposium on Semiconductor Wafer Bonding: Science, Technology, and Applications, Proceedings vol. 97–36, pp. 229–248, "Mechanistic Studies of Silicon Wafer Bonding and Layer Exfoliation", (no date).

S. Schulze, et al., Proceedings of the Second International Symposium on Microstructures and Microfabricated Systems, Proceedings vol. 95–27, pp. 309–318, "Investigation of Bonded Silicon—Silicon–Interfaces Using Scanning Acoustic Microscopy", (no date).

Q.–Y. Tong, et al., 1999 IEEE International SOI Conference, pp. 104–105, "IOS—A New Type of Materials Combination for System–on–a–Chip Preparation," Oct. 1999.

Yozo Kanda, et al., Sensors and Actuators, vol. A21–A23, pp. 939–943, "The Mechanism of Field–Assisted Silicon–Glass Bonding", 1990.

Jiwei Jiao, et al., Sensors and Actuators, vol. A50, pp. 117–120, "Low–Temperature Silicon Direct Bonding and Interface Behaviours", 1995.

A. Berthold, et al., Sensors and Actuators, vol. A68, pp. 410–413, "Wafer–to–Wafer Fusion Bonding of Oxidized Silicon to Silicon at Low Temperatures", 1998.

Q.–Y. Tong, et al., Electrochemical and Solid–State Letters, vol. 1, No. 1, pp. 52–53, "Low Vacuum Wafer Bonding", 1998.

Gudrun Kissinger, et al., Sensors and Actuators, vol. A36, pp. 149–156, "Void–Free Silicon–Wafer–Bond Strengthening in the 200–400° C Range", 1993.

B.M. Arora, et al., J. Vac. Sci. Technol. vol. B5, No. 4, pp. 876–882, "Reactive Ion–Etching–Induced Damage in Silicon Using $SF_6$ Gas Mixtures", Jul./Aug. 1987.

Leslie A. Field, et al., Sensors and Actuators, vol. A21–A23, pp. 935–938, "Fusing Silicon Wafers with Low Melting Temperature Glass", 1990.

Stefan Bengtsson, et al., Journal of Electronic Materials, vol. 29, No. 7, "Room Temperature Wafer Bonding of Silicon Oxidized Silicon, and Crystalline Quartz", 2000.

P. Amirfeiz, et al., Journal of the Electrochemical Society, vol. 147, No 7, pp. 2693–2698, "Formation of Silicon Structures by Plasma–Activated Wafer Bonding", 2000.

Donato Pasquariello, et al., Journal of the Electrochemical Society, vol. 147, No. 7, pp. 2699–2703, "Oxidation and Induced Damage in Oxygen Plasma In Situ Wafer Bonding", 2000.

Donato Pasquariello, et al., Journal of the Electrochemical Society, vol. 147, No. 6, pp. 2343–2346, "Mesa–Spacers: Enabling Nondestructive Measurement of Surface Energy in Room Temperature Wafer Bonding", 2000.

M. Petzold, et al., Proceedings of the Third International Symposium on Semiconductor Wafer Bonding: Physics and Applications, Proceedings vol. 95–7, pp. 380–389, "Interface Strength Characterization of Bonded Wafers", (no date).

J. Bagdahn, et al., Proceedings of the Fourth International Symposium on Semiconductor Wafer Bonding: Science, Technology, and Applications, Proceedings vol. 97–36, pp. 291–298, "Characterisation of Directly Bonded Silicon Wafers by Means of the Double Cantilever Crack Opening Method", (no date).

A. Plöβl, et al., Materials Science & Engineering, vol. R25, Nos. 1–2, pp. 1–88, "Wafer Direct Bonding: Tailoring Adhesion Between Brittle Materials", Mar. 10, 1999.

Tadahiro Ohmi, et al., Proceedings Fifth International IEEE VLSI Multilevel Interconnection Conference, pp. 261–267, "VLSI Interconnects for Ultra High Speed Signal Propagation", Jun. 13–14, 1988.

William Liu, et al., IEEE Transactions on Electron Devices, vol. 40, No. 11, pp. 1917–1927, "Current Gain Collapse in Mircowave Multifinger Heterojunction Bipolar Transistors Operated at Very High Power Densities", Nov. 1993.

Darrell Hill, et al., IEEE Microwave and Guided Wave Letters, vol. 5, No. 11, pp. 373–375, "Novel HBT with Reduced Thermal Impedance", Nov. 1995.

J.F. Jensen, et al., IEEE Journal of Solid–State Circuits, vol. 30, No. 10, pp. 1119–1127, "A 3.2 GHz Second Order Delta–Sigma Modulator Implemented in InP HBT Technology", Oct. 1995.

Burhan Bayraktaroglu, et al., IEEE Electron Device Letters, vol. 14, No. 10, pp. 493–495, "Very High–Power Density CW Operation of GaAs/AlGaAs Microwave Heterojunction BiPolar Transistors", Oct. 1993.

Alex Q. Huang, IEEE Transactions on Electron Devices, vol. 43, No. 6, pp. 1029–1032, "Analysis of the Inductive Turn–Off of Double Gate MOS Controlled Thyristors", Jun. 1996.

Peter J. Wright, et al., IEEE Transactions on Electron Devices, vol. 36, No. 5, pp. 879–889, "The Effect of Fluorine in Silicon Dioxide Gate Dielectrics", May 1989.

D. Gräf, et al., J. Vac. Sci. Technol., A7(3), pp. 808–813, "Reaction of Water with Hydrofluoric Acid Treated Silicon (111) and (100) Surfaces", May/Jun. 1989.

Q.–Y. Tong, et al., MRS Bulletin, pp. 40–44, "Beyond "Smart–Cut®": Recent Advances in Layer Transfer for Material Integration", Dec. 1998.

Jan Haisma, Philips Journal of Research, vol. 49, No. 1/2, pp. 165–170, "Direct Bonding in Patent Literature", 1995.

G.A.C.M. Spierings, et al., Philips Journal of Research, vol. 49, No. 1/2, pp. 47–63, "Surface–Related Phenomena in the Direct Bonding of Silicon and Fused–Silica Wafer Pairs", 1995.

Peter P. Gillis, et al., Journal of Applied Physics, vol. 35, No. 3 (Part I), pp. 647–658, "Double–Cantilever Cleavage Mode of Crack Propagation", Mar. 1964.

A. Kazor, et al., Appl. Phys. Lett., vol. 65, No. 12, pp. 1572–1574, "Fluorine Enhanced Oxidation of Silicon at Low Temperatures", Sep. 19, 1994.

R. Williams, et al., Journal of Applied Physics, vol. 46, No. 2, pp. 695–698, "Mobile Fluoride Ions in $SiO_2$", Feb. 1975.

S.R. Kasi, et al., Appl. Phys. Lett., vol. 58, No. 25, pp. 2975–2977, "Chemistry of Fluorine in the Oxidation of Silicon", Jun. 24, 1991.

Rochdi Messoussi, et al., Jpn. J. Appl. Phys., vol. 35, Part 1, No. 4A, pp. 1989–1992, "Improvement of Rinsing Efficiency after Sulfuric Acid Hydrogen Peroxide Mixture ($H_2SO_4/H_2O_2$) by HF Addition", 1996.

Ritsuo Takizawa, et al., Jpn. J. Appl. Phys., vol. 27, No. 11, pp. L2210–L2212, "Ultraclean Technique for Silicon Wafer Surfaces with $HNO_3$–HF Systems", Nov. 1998.

R. Stengl, et al., Jpn. J. Appl. Phys., vol. 29, No. 12, pp. L2311–L2314, "Bubble–Free Silicon Wafer Bonding in a Non–Cleanroom Environment", Dec. 1988.

Takao Abe, et al., Jpn. J. Appl. Phys., vol. 29, No. 12, pp. L2311–L2314, "Silicon Wafer Bonding Mechanism for Silicon–on–Insulator Structures", Dec. 1990.

W.K. Chu, et al., Physical Review B, vol. 16, No. 9, pp. 3851–3859, "Distribution of Irradiation Damage in Silicon Bombarded with Hydrogen", Nov. 1, 1977.

Yasushiro Nishioka, et al., Appl. Phys. Lett., vol. 54, No. 12, pp. 1127–1129, "Dielectric Characteristics of Fluorinated Ultradry $SiO_2$", Mar. 20, 1999.

D. Kouvatsos, et al., Appl. Phys. Lett., vol. 61, No. 7, pp. 780–782, "Silicon–Fluorine Bonding and Fluorine Profiling in $SiO_2$ Films Grown by $NF_3$–Enhanced Oxidation", Aug. 17, 1992.

T. Höchbauer et al., Appl. Phys. Lett., vol. 75, No. 25, pp. 3938–3940, "Hydrogen Blister Depth in Boron and Hydrogen Coimplanted N–Type Silicon", Dec. 29, 1999.

Q.–Y. Tong, et al., Appl. Phys. Lett., vol. 70, No. 11, pp. 1390–1392, "Layer Splitting Process in Hydrogen–Implanted Si, Ge, SiC, and Diamond Substrates", Mar. 17, 1997.

Hideki Takagi, et al., Appl. Phys. Lett., vol. 74, No. 16, pp. 2387–2389, "Room–Temperature Bonding of Lithium Niobate and Silicon Wafers by Argon–Beam Surface Activation", Apr. 19, 1999.

M. Morita, et al., Appl. Phys. Lett., vol. 45, No. 12, pp. 1312–1314, "Fluorine–Enhanced Thermal Oxidation of Silicon in the Presence of $NF_3$", Dec. 15, 1984.

Karin Ljungberg, et al., Appl. Phys. Lett., vol. 62, No. 12, pp. 1362–1364, "Spontaneous Bonding of Hydrophobic Silicon Surfaces", Mar. 22, 1993.

Bernard S. Meyerson, et al., Appl. Phys. Lett., vol. 57, No. 10, pp. 1034–1036, "Bistable Conditions for Low–Temperature Silicon Epitaxy", Sep. 3, 1990.

Q.–Y. Tong, et al., Appl. Phys. Lett., vol. 72, No. 1, pp. 49–51, "A "Smarter–Cut" Approach to Low Temperature Silicon Layer Transfer", Jan. 5, 1998.

A. von Keudell, et al., Appl. Phys. Lett., vol. 71, No. 26, pp. 3832–3834, "Evidence for Atomic H Insertion into Strained Si—Si Bonds in the Amorphous Hydrogenated Silicon Subsurface from In Situ Infrared Spectroscopy", Dec. 29, 1997.

John S. Judge, J. Electrochem. Soc.: Solid State Science, vol. 118, No. 11, pp. 1772–1775, "A Study of the Dissolution of $SiO_2$ in Acidic Fluoride Solutions", Nov. 1971.

Q.–Y. Tong, et al., J. Electrochem. Soc., vol. 143, No. 5, pp. 1773–1779, "A Model of Low–Temperature Wafer Bonding and Its Applications", May 1996.

S. Mack, et al., J. Electrochem. Soc., vol. 144, No. 3, pp. 1106–1111, "Analysis of Bonding–Related Gas Enclosure in Micromachined Cavities by Silicon Wafer Bonding", Mar. 1997.

B. Aspar, et al., Microelectronic Engineering, vol. 36, pp. 233–240, "Basic Mechanism Involved in the Smart–Cut® Process", 1997.

Y. Albert Li, et al., Jpn. J. Appl. Phys., vol. 39, Part 1, No. 1, pp. 275–276, "Surface Roughness of Hydrogen Ion Cut Low Temperature Bonded Thin Film Layers", Jan. 2000.

Karin Ljungsberg, et al., Electrochemical Society Proceedings, vol. 95–7, pp. 163–173, "Modification of Silicon Surfaces with $H_2SO_4$: HF and $HNO_3$:HF for Wafer Bonding Applications", (no date).

Terry A. Michalske, et al., J. Am. Ceram. Soc., vol. 68, No. 11, pp. 586–590, "Closure and Repropagation of Healed Cracks in Silicate Glass", 1985.

P.J.H. Denteneer, et al., Physical Review B., vol. 39, No. 15, pp. 10809–10824, "Microscopic Structure of the Hydrogen–Boron Complex in Crystalline Silicon", May 15, 1989.

P. Gupta, et al., Physical Review B, vol. 37, No. 14, pp. 8234–8243, "Hydrogen Desorption Kinetics From Monohydride and Anhydride Species on Silicon Surfaces", May 15, 1988.

K. Bergman, et al., Physical Reviews B, vol. 37, No. 5, pp. 2770–2773, "Donor–Hydrogen Complexes in Passivated Silicon", Feb. 15, 1988.

A.H. Mahan, et al., Physical Review B., vol. 40, No. 17, pp. 12024–12027, "Characterization of Microvoids in Device–Quality Hydrogenated Amorphous Silicon by Small–Angle X–Ray Scatterin and Infrared Measurements", Dec. 15, 1989.

M. Niwano, et al., J. Appl. Phys., vol. 71, No. 11, pp. 5646–5649, "Morphology of Hydrofluoric Acid and Ammonium Fluoride–Treated Silicon Surfaces Studies by Surface Infrared Spectroscopy", Jun. 1, 1992.

Jeffrey T. Borenstein, et al., J. Appl. Phys., vol. 73, No. 6, pp. 2751–2754, "Kinetic Model for Hydrogen Reactions in Boron–Doped Silicon", Mar. 15, 1993.

L. Lusson, et al., J. Appl. Phys., vol. 81, No. 7, pp. 3073–3080, "Hydrogen Configurations and Stability in Amorphous Sputtered Silicon", Apr. 1, 1997.

S. J. Pearton, et al., Appl. Phys. A, vol. 43, pp. 153–195, "Hydrogen in Crystalline Semiconductors", 1987.

S.A. McQuaid, et al., J. Appl. Phys., vol. 81, No. 11, pp. 7612–7618, "Passivation, Structural Modification, and Etching of Amorphous Silicon in Hydrogen Plasmas", Jun. 1, 1997.

U. Bhattacharya, et al., IEEE Electron Device Letters, vol. 16, No. 8, pp. 357–359, "Transferred Substrate Schottky–Collector Heterojunction Bipolar Transistors: First Results and Scaling Laws for High fmax", Aug. 1995.

B. Agarwal, et al., IEEE Electron Device Letters, vol. 18, No. 5, pp. 228–231, "A 277–GHz fmax Transferred–Substrate Heterojunction Bipolar Transistor", May 1997.

Q. Lee, et al., IEEE Electron Device Letters, vol. 19, No. 3, pp. 77–79, "A > 400 GHz fmax Tranferred–Substrate Heterojunction Bipolar Transistor Technology", Mar. 1998.

Q. Lee, et al., IEEE Electron Device Letters, vol. 20, No. 8, pp. 396–398, "Submicron Transferred–Substrate Heterojunction Bipolar Transistors", Aug. 1999.

Kiyoshi Mitani, et al., Jpn. J. Appl. Phys., vol. 31, Part 1, No. 4, pp. 969–974, "A New Evaluation Method of Silicon Wafer Bonding Interfaces and Bonding Strength by KOH Etching", Apr. 1992.

Kiyoshi Mitani, et al., Jpn. J. Appl. Phys., vol. 39, No. 4, pp. 615–622, "Causes and Prevention of Temperature–Dependent Bubbles in Silicon Wafer Bonding", Apr. 1991.

R. Stengl, et al., Jpn. J. Appl. Phys., vol. 28, No. 10, pp. 1735–1741, "A Model for the Silicon Wafer Bonding Process", Oct. 1989.

Hyeokjae Lee, et al., IEDM Technical Digest, vol. 95–683, pp. 28.2.1–28.2.4, "A New Leakage Component Caused by the Interaction of Residual Stress and the Relative Position of Poly–Si Gate at Isolation Edge", Dec. 10–13, 1995.

G.A.C.M. Spierings, et al., Proceedings of the First International Symposium on Semiconductor Wafer Bonding: Science, Technology, and Applications, Proceedings vol. 92-7, pp. 18–32, "Diversity and Interfacial Phenomena in Direct Bonding", (no date).

Shoji Yamahata, et al., IEEE Gallium Arsenide Integrated Circuit Symposium, Technical Digest 1995, pp. 163–166, "Over 220–GHz–$f_T$–and–$f_{max}$ InP/InGaAs Double–Heterojunction Bipolar Transistors with a New Hexagonal Shaped Emitter", Oct. 29–Nov. 1, 1995.

W.E. Stanchina, et al., IEEE Gallium Arsenide Integrated Circuit Symposium, Technical Digest 1995, pp. 31–34, "An InP–Based HBT FAB for High–Speed Digital, Analog, Mixed–Signal, and Optoelectric Ics", Oct. 29–Nov. 1, 1995.

S. Nakamura, et al., IEDM Technical Digest, vol. 95, pp. 889–892, "Giga–Bit DRAM Cells with Low Capacitance and Low Resistance Bit–Lines on Buries MOSFET's and Capacitors by Using Bonded SOI Technology–Reversed–Stacked–Capacitor (RSTC) Cell–", Dec. 10–13, 1995.

J.B. Lasky, et al., IEDM Technical Digest, vol. 85, pp. 684–687, "Silicon–on–Insulator (SOI) by Bonding and Etch–Back", Dec. 1–4, 1985.

C. den Besten, et al., IEEE Micro Electro Mechanical Systems, pp. 104–109, "Polymer Bonding of Micro–Machined Silicon Structures", Feb. 4–7, 1992.

Farzad Pourahmadi, et al., IEEE Solid–State Sensor and Actuator Workshop: Technical Digest, pp. 144–147, "Variable–Flow Micro–Valve Structure Fabricated with Silicon Fusion Bonding", Jun. 4–7, 1990.

Peter Bjeletich, et al., Proceedings of the Fourth International Symposium on Semiconductor Water Bonding: Science, Technology, and Applications, Proceedings vol. 97–36, pp. 349–357, "Electrical Characterization of Plasma Bonded SOI", (no date).

R. Dekker, et al., IEDM Technical Digest, vol. 97, pp. 921–923, "An Ultra Low–Power RF Bipolar Technology on Glass", Dec. 7–10, 1997.

Takeshi Sunada, et al., Jpn. J. Appl. Phys., vol. 29, No. 12, pp. L2408–L2410, "The Role of Fluorine Termination in the Chemical Stability of HF–Treated Si Surfaces", Dec. 1990.

M. Yoshimaru, et al., J. Vac. Sci. Technol. A, vol. 15, No. 6, pp. 2915–2922, "Interaction Between Wafer and Fluorine–Doped Silicon Oxide Films Deposited by Plasma–Enhanced Chemical Vapor Deposition", Nov./Dec. 1997.

T.M. Duncan, et al., J. Appl. Phys., vol. 60, No. 1, pp. 130–136, "Study of Fluorine in Silicate Glass with $^{19}$F Nuclear Magnetic Resonance Spectroscopy", Jul. 1, 1986.

Eliezer M. Rabinovich, et al., J. Am. Ceram. Soc., vol. 72, No. 7, pp. 1229–1232, "Retention of Fluorine in Silica Gels and Glass", 1989.

Henry Nielsen, et al., J. Electrochem. Soc.: Solid–State Science and Technology, vol. 130, No. 3, pp. 708–711, "Some Illumination on the Mechanism of $SiO_2$ Etching in HF Solutions", Mar. 1983.

Q.–Y. Tong, et al., Electronics Letters, vol. 35, No. 4, pp. 341–342, "Low Temperature InP Layer Transfer", Feb. 18, 1999.

Q.–Y. Tong, et al., Materials Chemistry and Physics, vol. 37, pp. 101–127, "Semiconductor Wafer Bonding: Recent Developments", 1994.

W.P. Maszara, et al., J. Appl. Phys., vol. 64, No. 10, pp. 4943–4950, "Bonding of Silicon Wafers for Silicon–on–Insulator", Nov. 15, 1988.

M. Bruel, Electronics Letters, vol. 31, No. 14, pp. 1201–1202, "Silicon on Insulator Material Technology", Jul. 6, 1995.

No Author, Electronics Letters, vol. 14, No. 18, pp. 593–594, "C.M.O.S. Devices Fabricated on Buried $SiO_2$ Layers Formed by Oxygen Implantation into Silicon", Aug. 31, 1978.

N.Q. KhÁnh, et al., J. Electrochem. Soc. vol. 142, No. 7, pp. 2425–2429, "Nondestructive Detection of Microvoids at the Interface of Direct Bonded Silicon Wafers by Scanning Infrared Microscopy", Jul. 1995.

Q.–Y. Tong, et al., Adv. Mater., vol. 11, No. 17, pp. 1409–1425, "Wafer Bonding and Layer Splitting for Microsystems", 1999.

W.P. Maszara, J. Electrochem. Soc., vol. 138, No. 1, pp. 341–347, "Silicon–on–Insulator by Wafer Bonding: A Review", Jan. 1991.

M. Grundner, et al., Appl. Phys. A, vol. 39, pp. 73–82, "Investigations on Hydrophilic and Hydrophobic Silicon (100) Wafer Surfaces by X–Ray Photoelectron and High–Resolution Electron Energy Loss–Spectroscopy", 1986.

Wen Hsiung Ko, et al., IEEE Transactions on Electron Devices, vol. ED–26, No. 12, pp. 1896–1905, "Development of a Miniature Pressure Transducer for Biomedical Applications", Dec. 1979.

George P. Imthurn, et al., J. Appl. Phys., vol. 72, No. 6, pp. 2526–2527, "Bonded Silicon–on–Sapphire Wafers and Devices", Sep. 15, 1992.

M. Shimbo, et al., J. Appl. Phys., vol. 60, No. 8, pp. 2987–2989, "Silicon–to–Silicon Direct Bonding Method", Oct. 15, 1986.

J.B. Lasky, Appl. Phys. Lett., vol. 48, No. 1, "Wafer Bonding for Silicon–on–Insulator Technologies", Jan. 6, 1986.

Ciarlo, Dino R., Proceedings of the Second International Symposium on Semiconductor Wafer Bonding: Science, Technology, and Applications, Proceedings vol. 93–29, pp. 313–326, "High–and–Low–Temperature Bonding Techniques for Microstructures", May 1993.

Ross, R.C., et al., Journal of Non–Crystalline Solids, vol. 66, pp. 81–86, "Physical Microstructure in Device–Quality Hydrogenated Amorphous Silicon", 1984.

Ko, W.H., et al., Micromachining and Micropackaging of Transducers, pp. 41–61, "Bonding Techniques for Microsensors", 1985.

Auberton–Hervé, et al., Proceedings of the Eighth International Symposium on Silicon Materials Science and Technology, Silicon Materials Science and Technology, vol. 2, Electrochemical Society Proceedings, vol. 98–1, pp. 1341–1360,"Silicon on Insulator Wafers Using the Smart Cut® Technology", 1998.

Mitani, Kiyoshi, Wafer Bonding: Studies of Interface Bubbles and Electrical Characterization, Department of Electrical Engineering, Duke University, 1991.

Q.–Y. Tong, et al., Semiconductor Wafer Bonding Science and Technology, John Wiley & Sons, Inc., 1999.

* cited by examiner-

METHOD OF EPITAXIAL-LIKE WAFER BONDING AT LOW TEMPERATURE AND BONDED STRUCTURE

BACKGROUND OF THE INVENTION

1. Field of the Invention

The present invention relates to a method of epitaxial-like bonding of wafer pairs at low temperature, and more particularly to a method of bonding in which the wafer surfaces are modified to create surface and subsurface defect areas, and possibly amorphized, by ion implantation or plasma, preferably by boron-containing ions or a plasma such as $B_2H_6$.

2. Discussion of the Background

For many optoelectronic and electronic device applications, homo-epitaxial single crystalline layers consisting of same material with same crystalline orientation but different doping types or levels are necessary. For some device applications, active layers comprising single crystalline dissimilar materials are required. The active layers should be high crystallographic quality with interfaces that are thermally conductive and almost optical loss free. Conventional hetero-epitaxial growth techniques applied to these lattice mismatched active layers usually result in a large density of threading dislocations in the bulk of the layers. Bonding of single crystalline wafers of identical or dissimilar materials is an unique alternative approach to the epitaxial growth. Not only highly lattice-mismatched wafers can be bonded but also wafers with different crystalline orientations can be combined. Ideally, the mismatches of single crystalline bonding wafers are accommodated by dislocations (in lattice-mismatch case) or an amorphous layer (in orientation-mismatch case) localized at the bonding interface with no defects generated in the bulk area. This approach is termed epitaxial-like bonding. The epitaxial-like bonding can also be employed to prepare unique devices by integrating already processed device layers.

However, conventional epitaxial-like bonding is achieved by high temperature annealing. To bond wafers composed of thermally mismatched materials, severe and often damaging thermal stresses can be induced with high temperature annealing. Since thermal stresses can increase significantly with the size of dissimilar wafers, only small wafers currently can be epitaxially bonded at high temperatures. The high temperature annealing process can also produce unwanted changes to bonding materials and often prevents the bonding of processed device wafers. The bonding materials may decompose at high temperatures, even if the bonding wafers are thermally matched.

In order to epitaxially bond large wafers of dissimilar materials or processed wafers, an epitaxial-like bonding interface must be achieved at or near room temperature, or one wafer of the bonded pair must be thinned sufficiently before annealing to elevated temperatures. Although G oesele et al. in Applied Physics Letters 67, 3614 (1995) and Takagi et al in Applied Physics Letters 74, 2387, 1999 reported room temperature epitaxial-like bonding of silicon wafers in ultrahigh vacuum, high temperature (>600° C.) pre-annealing in the former case or high external pressure (>1 MPa) in the latter case were required to achieve the bond that may introduce undesired effects to the bonding wafers.

Recently, M. Bruel in Electronics Letters 31,1201 (1995) reported a promising generic thinning approach using a hydrogen-induced layer transfer method (so-called smart-cut method). In this approach, H atoms are implanted into a Si wafer to such concentration that a significant fraction of Si—Si bonds are broken creating a buried H-rich layer of micro-cracks susceptible to cleavage or fracture. By bonding the topmost oxide covered hydrophilic Si wafer surface to another substrate, a thin layer of the Si wafer can then be transferred by fracture of the H-rich region. However, this process requires that the bonding energy between the bonded wafers be higher than the fracture energy of the hydrogen-induced crack region at the layer transfer temperature. The layer transfer temperatures must be lower than the temperature beyond which hydrogen molecules in the material become mobile. For silicon, the temperature is about 500° C. (see Chu et al in Physics Review B, 16, 3851 (1987)). The bonding energy of conventional HF dipped hydrophobic silicon wafer pairs is higher than the hydrogen-induced region only after annealing at temperatures higher than 600° C. Therefore, this process does not work for oxide-free hydrophobic silicon wafer bonding.

Typically, HF-dipped, hydrogen-terminated hydrophobic silicon wafers are used to realize epitaxial-like bonding after annealing at >700° C. In order for bonded hydrophobic silicon wafer pairs to reach bulk fracture energy, Tong et al. in Applied Physics Letters 64, 625 (1994) reported that hydrogen (from HF-dip, mainly Si—$H_2$ and Si—H terminated hydrophobic silicon surfaces at the bonding interface) must be removed so that strong Si—Si epitaxial bonds across the mating surfaces can be formed. The reaction is illustrated in Equation (1).

$$\text{Si—H+H—Si} \rightarrow \text{Si—Si+H}_2 \qquad (1)$$

The release of hydrogen from a stand-alone silicon wafer dipped in HF was demonstrated to start at about 367° C. from Si—$H_2$ and 447° C. from Si—H in an ultrahigh vacuum. Since hydrogen molecules become mobile in silicon only at temperatures higher than 500° C., annealing at temperatures higher than 700° C. have been found necessary to completely deplete hydrogen from the bonding interface that results in a high bonding energy. Therefore, the smart-cut method for a layer transfer using conventional HF-dipped silicon wafer pairs is not possible because the bonding energy is too low at layer transfer temperatures that are lower than 500° C.

Based on above arguments, it becomes clear that the development of a low temperature epitaxial-like wafer bonding technology that is both cost-effective and manufacturable is essential for many advanced materials and device applications.

SUMMARY OF THE INVENTION

Accordingly, one object of this invention is to provide a wafer bonding method and bonded structure in which epitaxial-like bonding is achieved at near room temperature in ambient conditions without an external pressure.

Another object of this invention is to provide a wafer bonding method and bonded structure using bonding surfaces treated to obtain amorphized or partially amorphized surfaces by ion implantation or plasma, preferably by boron-containing ions or plasma.

These and other objects of the present invention are provided by a method for bonding first and second substrates including steps of preparing substantially oxide-free first and second surfaces of respective first and second substrates, creating a surface defect region in each of said first and second surfaces, and bonding said first and second surfaces. Creating the defective region may include plasma-treating the first and second surfaces of the first and second substrates with a plasma, and preferably a boron-containing plasma. The plasma-treating step may utilize a plasma in reactive ion etch (RIE) mode using $B_2H_6$ gas, and possibly a mixture of $B_2H_6$, He, and Ar gases. Other gas plasmas, such as Ar may also be used.

As a result of the plasma-treating step, a thin amorphous layer may be formed in the first and second surfaces. A monolayer of boron may also be on said first and second surfaces and first and second surfaces may be doped with boron when a boron-containing plasma is used. Also, a few monolayers of boron are introduced into each of the first and second surfaces during said plasma-treating step.

After contacting, the substrates are maintained in contact, preferable under low vacuum but also in ambient air. A bonding energy of about 400 mJ/m$^2$ may be obtained at room temperature. Also, when the bonded pair of substrates is maintained at a temperature no more than about 250° C. after contacting, a bond strength of at least about 1500 mJ/m$^2$ may be obtained, and a bonding energy of about 2500 mJ/m$^2$ (bulk silicon fracture energy) may be obtained at 350° C. The method may also include step of annealing said bonded first and second surfaces at a temperature in the range of about 250–450° C., or at a temperature not exceeding about 350° C. A substantial portion of said amorphous layers in said first and second surfaces may be recrystallized, possibly in a separate annealing step.

The creating step may also include ion-implanting the first and second surfaces. As or B may be used to implant the surfaces. In the case of B, a surface layer is formed on the surface of the substrate and the energy of the implant is chosen to place the peak of the concentration profile at approximately the interface between the substrate surface and the surface layer. In the case of As, the surface is directly implanted and a thicker amorphous layer may be formed.

After contacting, the implanted substrates are maintained in contact, preferable under low vacuum but also in ambient air. The bonded pair may be heated at a temperature no more than about 400° C. The bonded pair of substrates may be maintained at a temperature no more than about 400° C. after contacting. A bonding energy of about 2500 mJ/m$^2$ (bulk silicon fracture energy) may be obtained.

To obtain the substantially oxide-free surfaces, the substrates may be immersed in a first etching solution, such as a hydrofluoric acid solution, before said plasma-treating step, and immersed in a second etching solution, such as a hydrofluoric acid solution, after said plasma-treating step. The substrates may be cleaned before immersing in the first etching solution, preferably using an RCA-1 solution.

The method may also include plasma treating an exposed surface of the bonded pair of substrates in a boron-containing plasma, and bonding a third wafer to said exposed surface.

The method may also include creating the defect region or amorphous layer in the surface of a silicon layer formed on a semiconductor device wafer. Two or more of the treated wafers may be bonded together.

The first and second substrates may be selected from Si, InGaAs, Inp; GaAs, Ge, SiC and other semiconductors.

The objects of the invention may also be achieved by a method including amorphization of first and second surfaces of first and second silicon substrates by ion implantation or plasma, and contacting the first and second surfaces to form a bonded pair of substrates. The substrates may be immersed in a first hydrofluoric acid solution before said amorphization step, and immersed in a second hydrofluoric acid solution after said amorphization step by plasma. The substrates may be cleaned before immersing in the first hydrofluoric acid solution, preferably using an RCA-1 solution. The amorphization step may utilize arsenic (As) ion implantation or argon (Ar) RIE plasma.

After contacting, the substrates are maintained in contact, preferable under low vacuum but also in ambient air. The bonded pair may be heated at a temperature no more than about 400° C. The bonded pair of substrates may be maintained at a temperature no more than about 400° C. after contacting. A bonding energy of about 2500 mJ/m$^2$ (bulk silicon fracture energy) may be obtained. The bonded amorphous layers at the bonding interface can be completely recrystallized after annealing at 450° C.

The objects of the invention may also be achieved by a bonded structure having a first substrate having a first surface, a first amorphous layer formed in the first surface, and a second substrate having a second surface, a second amorphous layer formed in the second surface. The first surface is bonded to the second surface to form a bonded pair of substrates.

One of said first and second substrates of said bonded pair may have a third surface with an amorphous layer. A third substrate having a fourth surface, with a fourth amorphous layer formed in said fourth surface may be bonded to the bonded pair.

The first and second surfaces may comprise a surface exposed to boron-containing plasma. One of the first and second substrates of the bonded pair may have a planar surface exposed to boron-containing plasma bonded to a third surface of a third substrate exposed to boron-containing plasma. The first, second and third substrates may be selected from Si, InGaAs, InP, GaAs, Ge, SiC and other semiconductors.

The first and second substrates may comprise respective first and second semiconductor devices, the first surface may comprise a substantially planar surface of a first silicon layer formed on the first device, and the second surface may comprise a substantially planar surface of a second silicon layer formed on the second device.

The first surface may comprise a first silicon surface exposed to an inert gas plasma, and the second surface may comprise a second silicon surface exposed to an inert gas plasma.

The first surface may comprise a first silicon surface implanted with boron, and the second surface may comprise a second silicon surface implanted with boron.

The first surface may comprise a first silicon surface implanted with arsenic, and the second surface may comprise a second silicon surface implanted with arsenic.

The bonded structure according to the invention may include a first substrate having an amorphized first surface and containing boron and a second substrate having an amorphized second surface and containing boron, with the first surface being bonded to the second surface to form a bonded pair of substrates. The first and second substrates may be selected from Si, InGaAs, InP, GaAs, Ge, SiC and other semiconductors.

The first surface may comprise a first silicon surface exposed to a boron-containing plasma, and the second surface may comprise a second silicon surface exposed to a boron-containing plasma.

The first surface may comprises a first silicon surface implanted with boron, and the second surface may comprise a second silicon surface implanted with boron.

The bonded structure may also have a first substrate having a first surface implanted with boron, and a second substrate having a second surface implanted with boron. The first surface is bonded to said second surface to form a bonded pair of substrates. One of the first and second substrates of the bonded pair may have a planar surface implanted with boron. A third surface, implanted with boron, of a third substrate may be bonded to the planar surface. The first, second and third substrates may be selected from Si, InGaAs, InP, GaAs, Ge, SiC and other semiconductors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
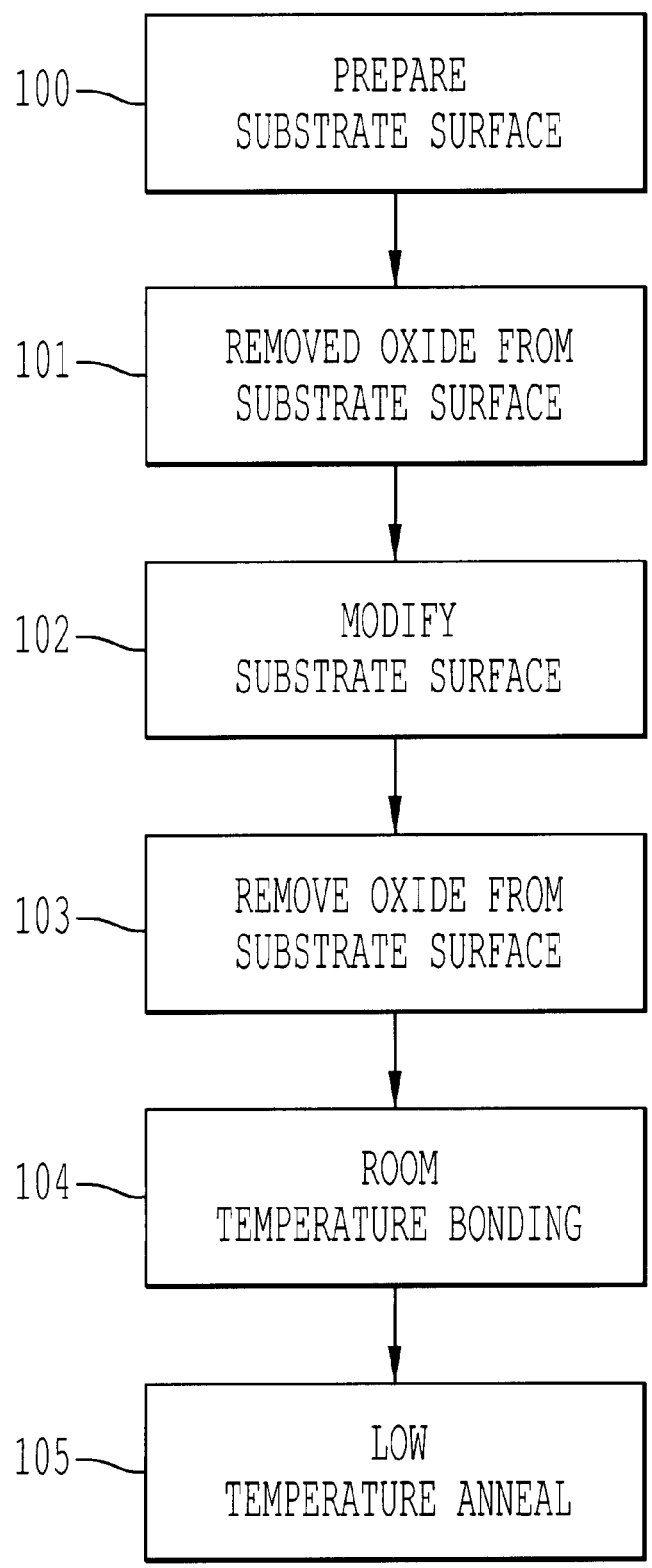
FIG. 1 is a flow chart illustrating method steps of the present invention.

Referring now to the drawings, wherein like reference numerals designate identical or corresponding parts throughout the several views, and more particularly to FIG. 1 thereof, FIG. 1 shows method steps of the present invention. In step 100, the substrates are cleaned using, for example, a wet RCA-1 ($H_2O+H_2O_2+NH_4OH$) solution. Other cleaning methods are possible, such as $H_2SO_4+H_2O_2$ or dry clean. Following the cleaning step using the RCA-1 solution, the substrates are immersed in step 101 in a hydrofluoric acid aqueous solution such as 1%HF solution to remove the surface thin native oxide layer. Upon removal from the hydrofluoric acid solution, the surfaces of the substrates are modified by creating surface and/or subsurface damage areas by ion implantation or plasma, preferably using boron-containing ions or boron-containing plasma, in step 102. By subsurface, it is meant at least the layer of atoms below the surface layer. The treatment may approach or reach amorphization to form a thin amorphous layer may be formed in the surface of the substrates. The surface treatment, when using boron, may introduce boron into the substrate surface.

Upon termination of the treatment, the substrates in step 103 are immersed in a dilute hydrofluoric acid aqueous solution such as 1%HF solution to remove the surface thin native oxide layer or any other oxide formed on the surface. Surfaces of the substrates which were treated in step 103 are placed together in step 104 at room temperature in atmosphere and form a room temperature bonded substrate pair. The attached substrate pair is preferably placed inside a low vacuum system, but may also be placed in ambient. The bonded pair is then annealed at low temperatures in step 105. The temperature may be selected to recrystallize the thin amorphous layers formed during the ion implantation or plasma treatment. Recrystallization may also be carried out in a separate annealing procedure. The wafer bonding method of the present invention achieves high bonding energy near room temperature.

Figure 2A:
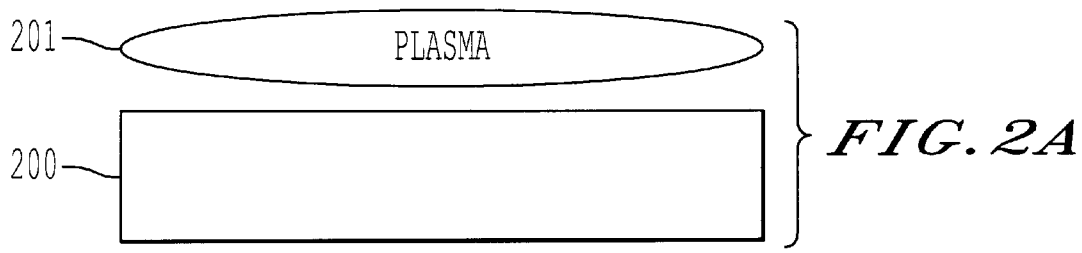
FIGS. 2A–2E are sectional diagrams illustrating a first embodiment of the method according to the invention, and a bonded structure according to the invention.
Figure 2B:
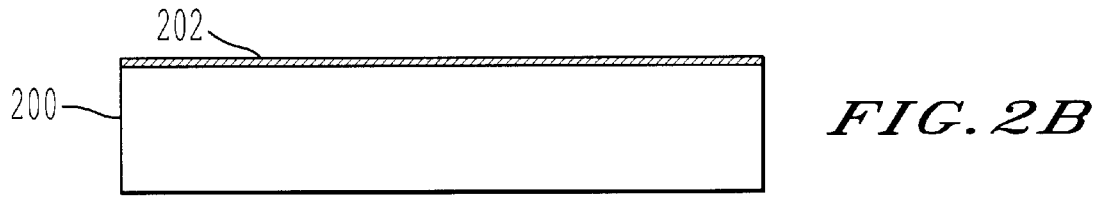
Figure 2C:
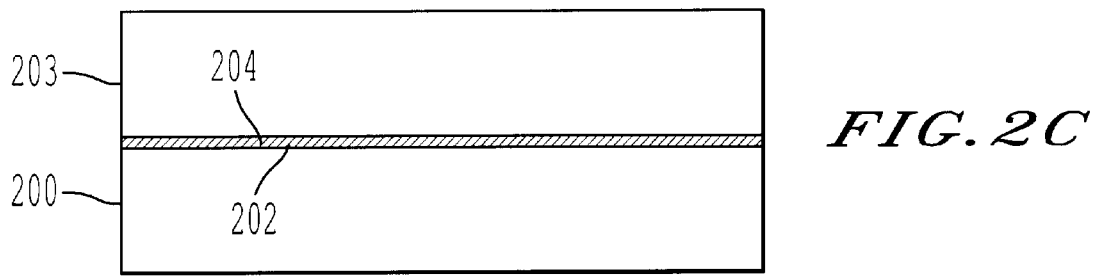
Figure 2D:
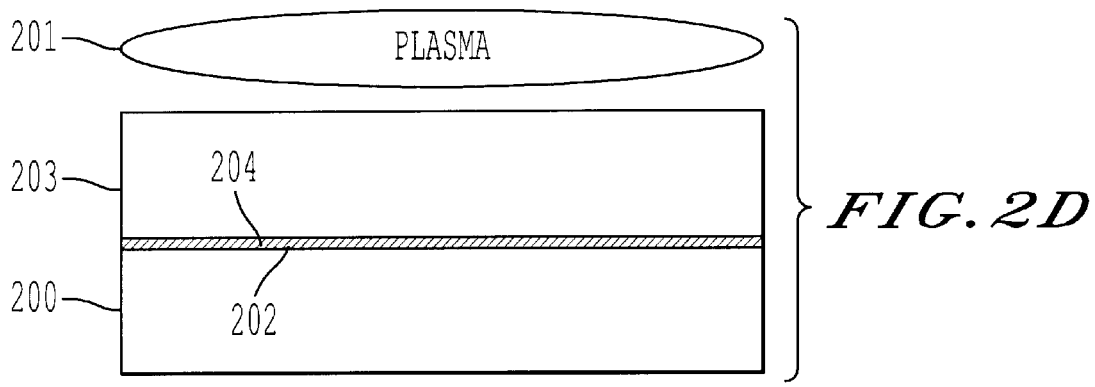
Figure 6:
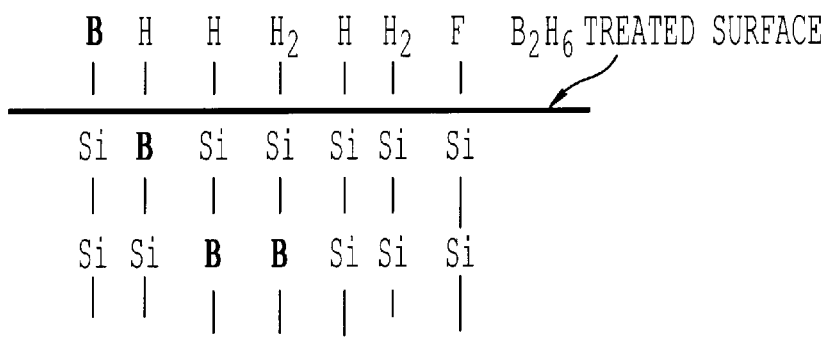
FIG. 6 is a schematic of surface terminations on $B_2H_6$ plasma treated and HF dipped silicon wafers.

FIGS. 2A–2E show sectional views of the first embodiment of the method according to the invention. In FIG. 2A, a substrate 200, after immersing in the aqueous HF solution, is exposed to a plasma 201. FIG. 2B illustrates wafer 200 after the plasma treatment. The plasma modifies the surface 202 of the wafer to create defect areas and possibly a thin amorphous layer. Subsurface (the layer adjacent the surface) defect areas may also be formed. Surface 202 is drawn with a heavier line to illustrate the defective area or amorphous layer formed by the plasma treatment. The amorphous layer formed is about a few nm or more in thickness. In a preferred case, the plasma is a boron-containing plasma and, most preferably, a $B_2H_6$ plasma. The position of the B in the surface structure will be described below in connection with FIG. 6.

Figure 2E:
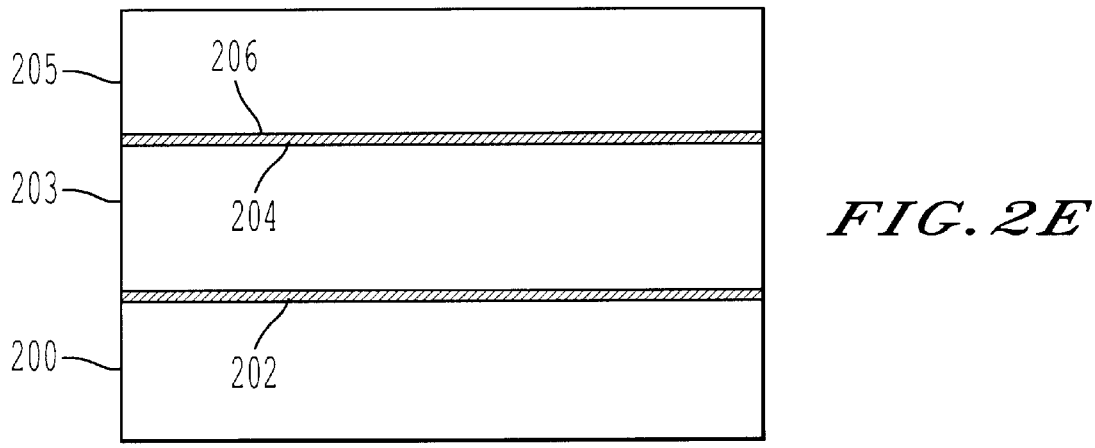

The wafer is immersed in the aqueous HF solution as described above. Another wafer 203 having a similarly plasma treated surface 204 is placed in contact with wafer 200 with surfaces 202 and 204 directly contacted to form the bonded structure at room temperature in FIG. 2C. The bonded structure is annealed at a low temperature and is then ready for further processing, such as low-temperature annealing, substrate lapping, device formation, etc., or a combination of processes. The process may be continued by plasma-treating the exposed surface 205 of wafer 203 (FIG. 2D) and bonding it to another plasma-treated surface 207 of wafer 206 (FIG. 2E). Any number of substrates may be bonded together.

EXAMPLE 75 mm diameter, 1–10 ohm-cm, p-type Si (100) substrate wafers were used. The wafers were cleaned in a RCA-1 solution, dipped in a 1% hydrofluoric aqueous solution followed by treatment in $B_2H_6$ plasma for an appropriate time period depending on the plasma system used. Appropriate plasma treatment times have ranged from 30 sec. to 5 min. The B$_2$H$_6$ plasma treatment consisted of a mixed gas of 20 sccm of 0.5% B$_2$H$_6$/99.5%He and 20 sccm Ar in an inductor coupled plasma (ICP) operating in a reactive ion etch mode with a RF power of 38 W at a pressure of ~5 mTorr. A ~100 V self-biased voltage was generated. This self-bias is the lowest possible self-bias for a stable plasma treatment in the plasma treatment system used herein. The wafers were then dipped in a diluted 1% HF solution to remove any oxide on the wafer surfaces. The wafers were then placed together without water rinse and bonded in air at room temperature.

Figure 3:
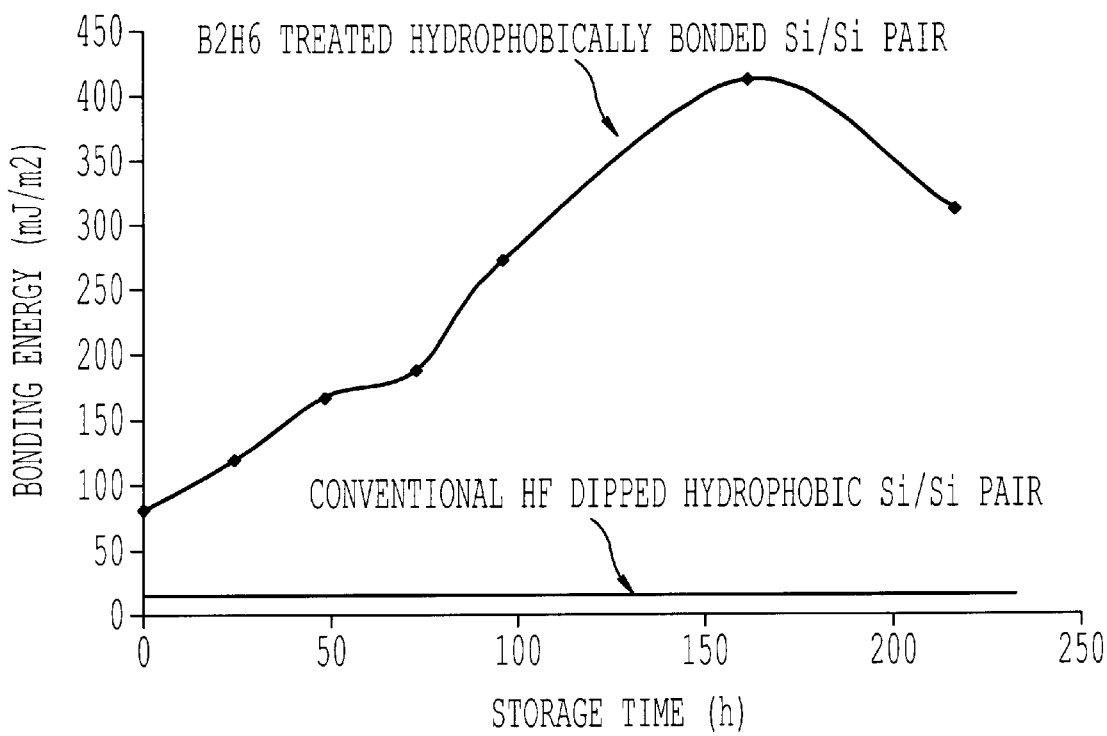
FIG. 3 is graph depicting room temperature bonding energy as a function of storage time of bonded pairs of $B_2H_6$ treated hydrophobic silicon wafers.

The bonded wafer pair was stored in a low vacuum chamber at a vacuum level of about, for example, 700 Pa. The vacuum level is not critical. The bonding energy (specific surface energy) of the bonded pairs was determined by measuring the crack length introduced by inserting a razor blade into the bonding interface to partially separate the two wafers. FIG. 3 shows the room temperature bonding energies as a function of storage time for B$_2$H$_6$ plasma-treated hydrophobic bonded silicon wafers. Compared with a typical room temperature bonding energy of ~10–20 mJ/m$^2$ for conventional HF-dipped silicon wafer pairs, the bonding energy of ~400 mJ/m$^2$ for the B$_2$H$_6$ treated pairs is remarkably higher. A few interface bubbles were formed during low vacuum storage at room temperature, which supports the latter explanation that hydrogen released from the bonding interfaces is responsible for the increase of bonding energy at room temperature.

Figure 4:
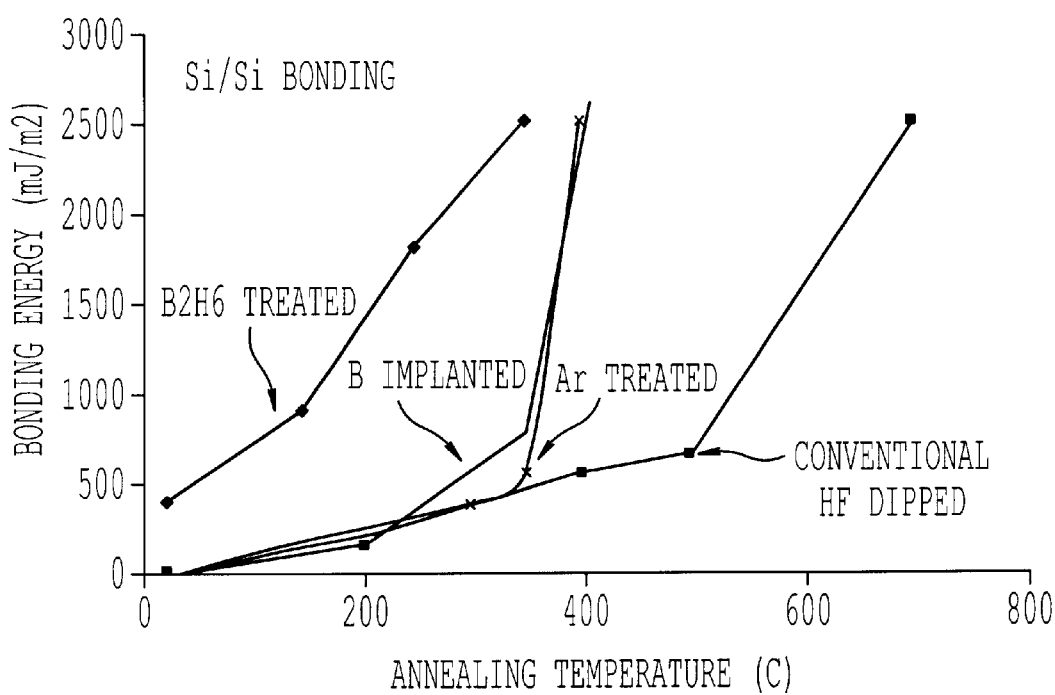
FIG. 4 is a graph depicting bonding energy as a function of annealing temperature of $B_2H_6$ treated, boron-implanted treated, Ar plasma treated, and conventional hydrophobic (HF dipped only) silicon wafer pairs.

Bonding energy as a function of annealing temperature of B$_2$H$_6$ treated, boron-implanted treated, Ar plasma treated, and conventional hydrophobic (HF dipped only) silicon wafer pairs is shown in FIG. 4. It is important to note that for the B$_2$H$_6$ plasma treated samples, the bonding energy was ~900 mJ/m$^2$ at 150° C. and ~1800 mJ/m$^2$ at 250° C., and reaches the fracture energy of bulk silicon ~2500 mJ/m$^2$ at 350° C. For comparison, FIG. 4 also shows the bonding energy as a function of annealing temperature of conventional BF dipped silicon wafer pairs. TEM (Transmission Electron Microscopy) measurements have shown that the expitaxial bonding interface in the Si/Si bonded pairs was realized after 350° C. annealing.

Figure 5:
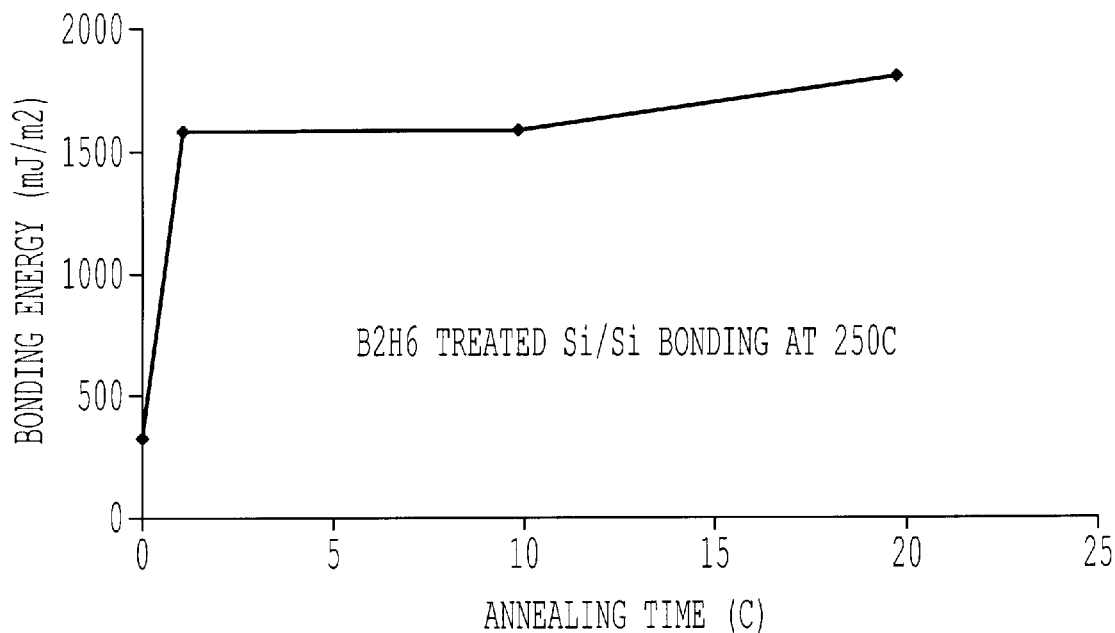
FIG. 5 is a graph depicting bonding energy as a function of annealing time at 250° C. for $B_2H_6$ treated wafer pairs.

A typical example of bonding energy as a function of annealing time at 250° C. is shown in FIG. 5. The bonding energy increases quickly with annealing time and is saturated after ~20 h annealing at 250° C. A few bubbles were generated during annealing indicating that the increase in bonding energy is associated with the release of hydrogen at the bonding interface.

The B$_2$H$_6$ plasma treatment of present invention places boron not only on the surface but also in subsurface layers due to the self-bias voltage. After the HF dip, in addition to Si—H$_2$, Si—H and Si—F surface terminations, the B$_2$H$_6$ plasma-treated silicon surfaces will likely be terminated by Si—B:H from top surface boron atoms forming Si—B groups, by Si—B—H groups by boron at the first surface layer, and by Si—H and Si—H$_2$ groups that have subsurface boron atoms terminated to the silicon atoms, see FIG. 6. The bonding interface between the silicon wafer pair is most likely bridged by HF molecules resulting from the HF dip that can be removed by storage in low vacuum or in ambient at room temperature.

Since B—H complexes are very weakly polarized due to their similar electronegativity, the following reactions at the bonding interface are likely responsible for the increase in bonding energy at room temperature:

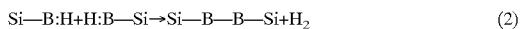

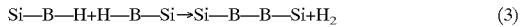

The removal of hydrogen terminations on the boron atoms leads to a Si—B—B—Si bridging bond attaching one substrate to another. Moreover, as reported by Kim et al. in Applied Physics Letters 69, 3869 (1996), subsurface boron in the second layer weakens the surface Si—H bond. Hydrogen desorption from the bonding surfaces of B$_2$H$_6$ treated silicon wafers can take place at low temperatures resulting in a silicon covalent bond formation across the interface between the substrates as shown by the following reaction:

The boron-assisted reaction completely depletes hydrogen from the bonding interface at temperatures of 350–400° C. which is lower than a 700° C. temperature which is required for conventional HF dipped silicon substrate bonding, when no boron is present.

In a second embodiment, an inert gas plasma is used to create the defective area and thin amorphous layer. The third embodiment preferably uses an Ar-only plasma treatment to enhance the bonding energy at low temperatures, also shown in FIG. 4. Method steps for an Ar-only plasma treatment bonding process follow all the steps shown in FIG. 1. After cleaning in RCA1 solution (step 100), silicon wafers are dipped in 1%HF solution to remove the native oxide layer of any other oxide layer (step 101). The wafers are placed in the RIE plasma system and treated with Ar plasma in 30–100 mtorr for 15 seconds to 20 minutes. Ar plasma is generated by applying a RF power from 80–200 W at 13.56 MHz (step 102). The surface self-bias voltage is in the range of 200 V to 400 V. These Ar plasma treated wafers are dipped in 1%HF to remove any surface oxide layer (step 103) and bonded at room temperature in air (step 104). After storage in low vacuum for ~20 hrs (step 105), the bonded pairs are annealed. The bonding energy reaches the bulk silicon fracture energy (2500 mJ/m$^2$) at 400° C. The bonding energy enhancement is likely due to that the amorphous layer formed by the Ar plasma treatment readily absorbs the hydrogen released from surface Si—H$_2$ and Si—H groups that takes place at about 300° C. The amorphous layer at the bonding interface may be recrystallized at low temperatures. Ar-only plasma treatment to enhance low temperature epitaxial-like bonding is especially attractive for applications that requires no monolayers of boron at the bonding interface.

Figure 7:
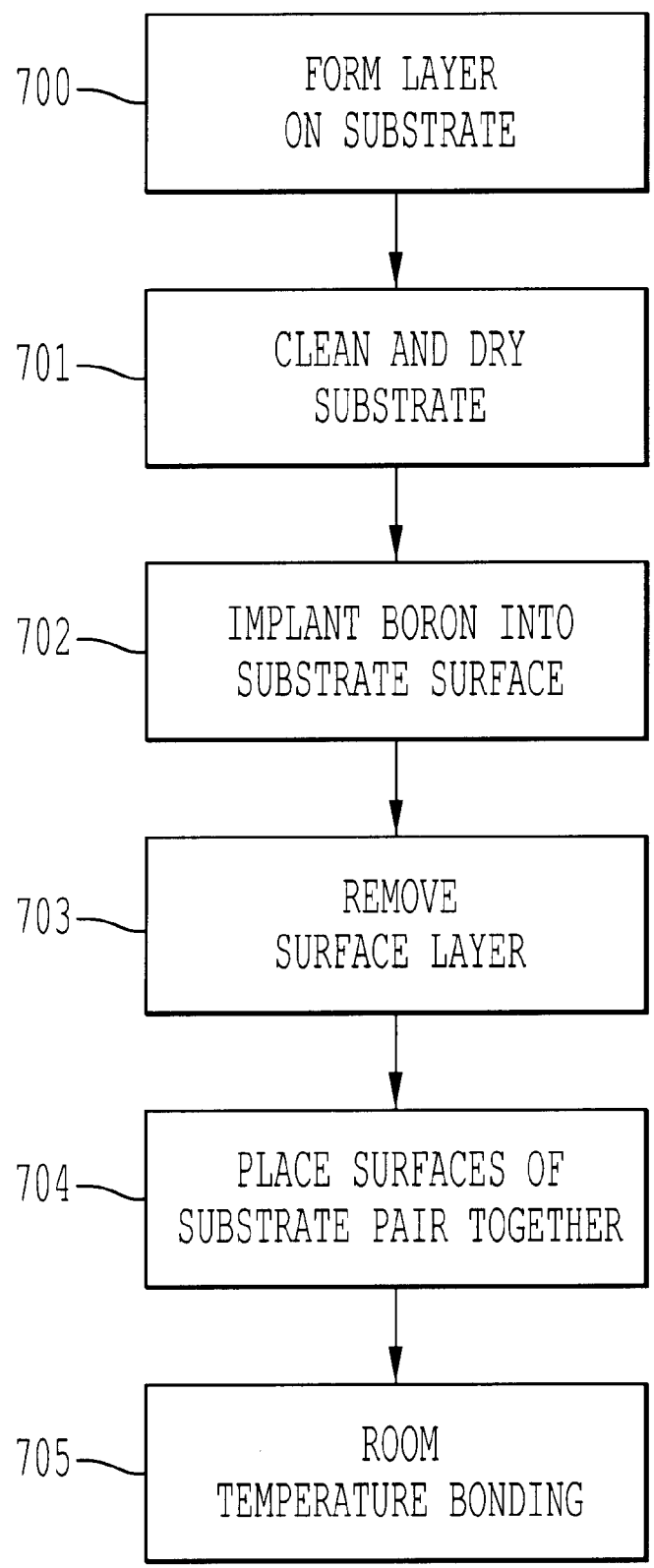
FIG. 7 is a flow chart showing a second embodiment of the method according to the present invention.

A third embodiment of the present invention (shown in FIG. 7) is to use ion implantation to place boron onto the surfaces of bonding substrates. In step 700, the substrates are covered by a masking layer, preferably an oxide layer. The substrates are cleaned using, for example, a wet RCA-1 solution and dried. in step 701. Surfaces of the substrates are implanted with boron using BF$_3$ as shown in step 702 to place the boron concentration peak at the oxide/silicon interface. As an example, forming an 800 Å thick thermal oxide on silicon wafers, boron implantation at an energy of 20 keV with a dose of 5×10$^{14}$/cm$^2$ places boron concentration peak of 6×10$^{19}$/cm$^2$ at the oxide/silicon interface. Employing a 6700 Å thick thermal oxide on silicon wafers, boron implantation at an energy of 180 keV with a dose of 5×10$^{14}$/cm$^2$ places boron concentration peak of 2.5×10$^{19}$/cm$^2$ at the oxide/silicon interface.

Following boron implantation, the substrates in step 703 are immersed in a dilute hydrofluoric acid solution to remove the oxide layer. Surfaces of the substrates which were boron-implanted in step 702 are bonded at room temperature in step 704. The attached pair is preferably placed inside a low vacuum system and annealed in air at low temperature in step 705.

Boron implantation in bonding silicon wafers can achieve the bulk silicon fracture energy at ~400° C. The bonding energy enhancement at room temperature seen with the boron plasma treated wafers is not achieved. Instead, a significant increase in bonding energy is seen at temperatures above than 300° C., as shown in FIG. 4. It is likely that lower boron concentrations on the wafer surfaces for the boron implantation treatment in comparison to the plasma treatment case delays bonding enhancement until higher annealing temperatures are used.

Released hydrogen shown in equation (4) can build an internal pressure that offsets the bonding strength at the bonding interface. In order to alleviate the internal gas pressure, released hydrogen molecules need to be removed from the interface. The plasma or ion implantation treatment according to the invention induces a defective surface layer towards amorphization providing hydrogen trapping sites. Plasma or ion implantation treatments using other gases containing boron are expected to work as well.

Figure 8A:
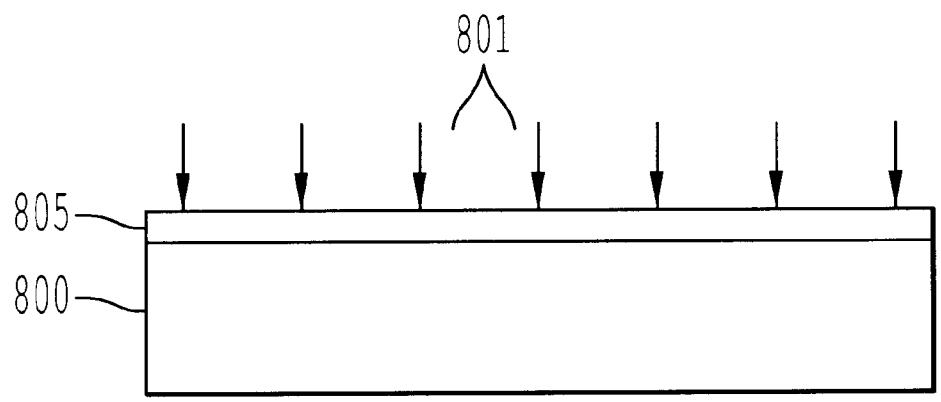
FIGS. 8A–8C are sectional diagrams illustrating a second embodiment of the method according to the invention, and a bonded structure according to the invention.
Figure 8B:
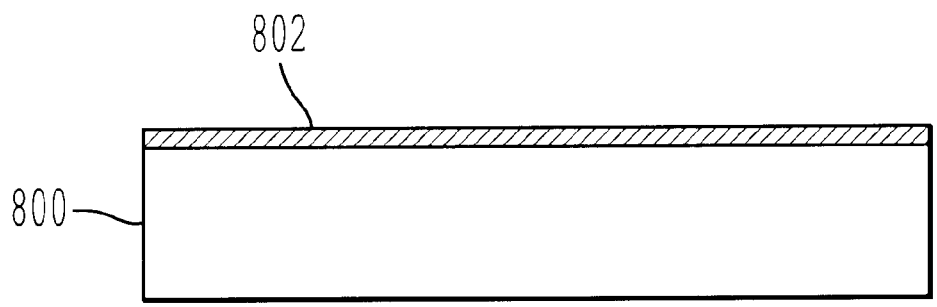
Figure 8C:
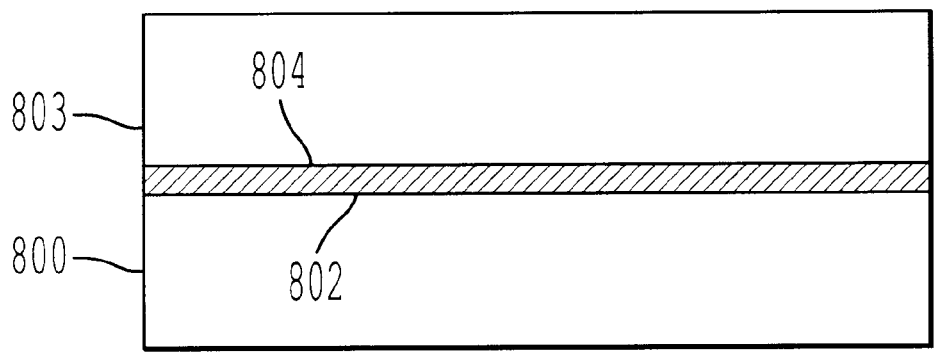

FIGS. 8A–8C show cross sectional views of the third embodiment of the method. Ions 801 are implanted into a wafer 800 having a masking film 805, such as $SiO_2$, formed on the surface, as shown in step 8A. The masking film 805 allows the energy of the implant to be adjusted so that the peak of the concentration distribution is at the surface of wafer 800. As shown in FIG. 8B, the wafer 800 has a modified surface 802 (shown with heavier line for illustrative purpose only) after removing the masking layer by immersing in an aqueous HF solution, in the case of layer 305 being $SiO_2$. Another wafer 803 similarly treated with a modified surface 804 is placed in contact with wafer 800 at room temperature. The bonding of the two wafers is allowed to enhance with low-temperature annealing, as discussed above.

Figure 10:
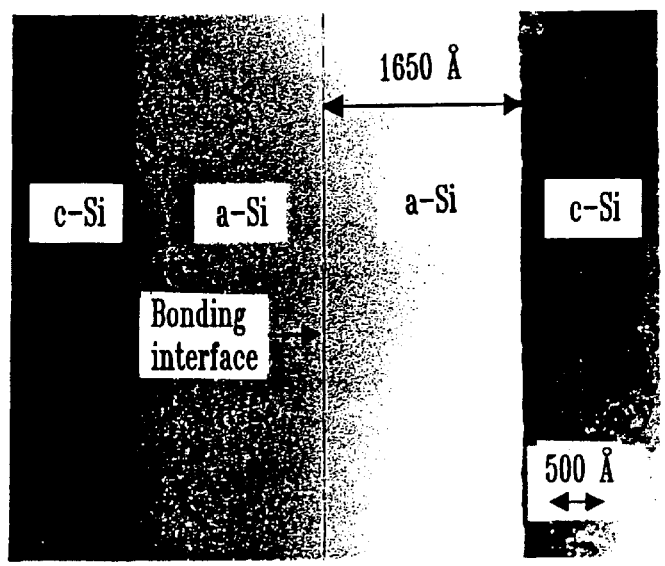
FIG. 10 is an TEM (Transmission Electron Microscopy) image of an As-implanted amorphous-Si/amorphous-Si (a-Si/a-Si) bonding interface.

A fourth embodiment of the present invention is to use As (arsenic) ion implantation to silicon wafers to form an amorphous layer on the wafer surface. Method steps for an As ion implantation treatment bonding process follow the steps shown in FIG. 1. After cleaning, As ion implantation is performed at an energy of 180 keV with a dose of $9 \times 10^{14}/cm^2$. Any oxide layer is then removed prior to bonding. The As doping concentration peak of $8 \times 10^{19}/cm^3$ is located at 1150 Å from the silicon surface. Although this implantation induced a very low As doping on the wafer surface, an amorphous layer with 1650 Å thick was formed as confirmed both by a Monte Carlo simulation and TEM measurement (FIG. 10). The thickness of the amorphous layer can vary and is not limited to the value of this example. For instance, other ions may be implanted to create the amorphous layer. Arsenic is a dopant, and there are applications when it is desired not to dope the substrate so another ion, such as a non-doping ion like Ar, would be chosen.

Figure 9:
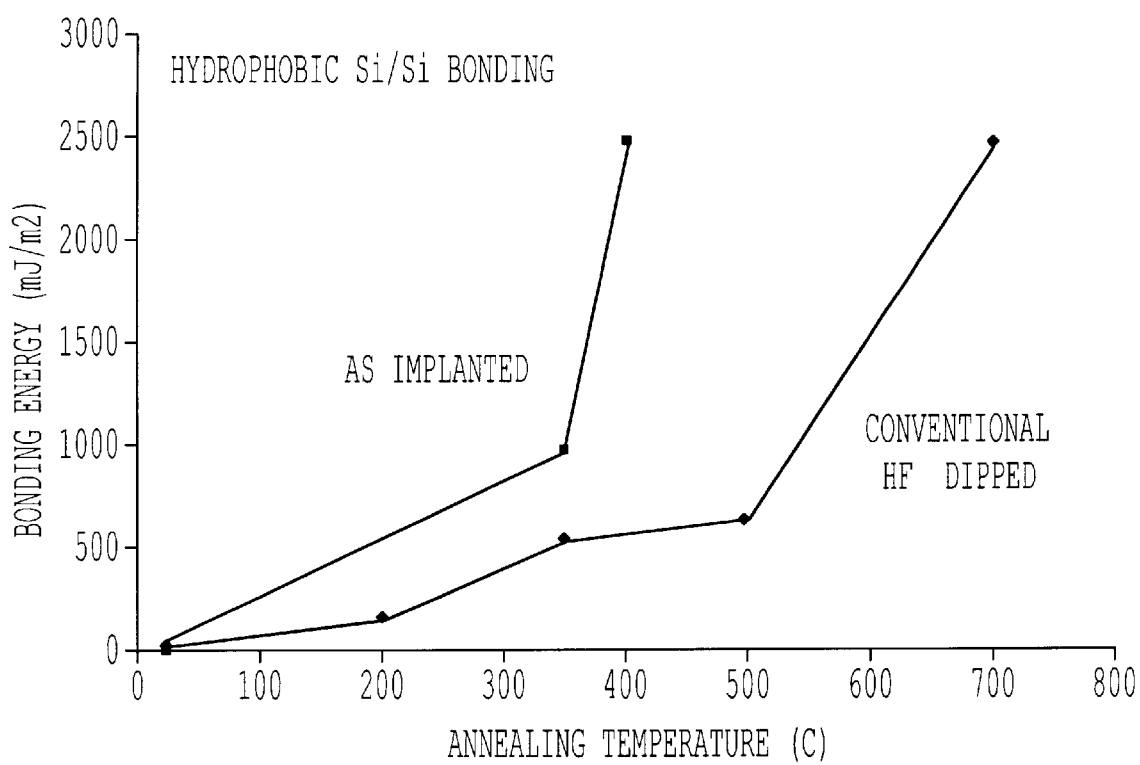
FIG. 9 is a graph depicting bonding energy as a function of annealing temperature.

After an HF dip to remove any oxide on the implanted surfaces, the wafers are bonded at room temperature in ambient conditions. After storage in low vacuum for ~20 h the bonded pairs are annealed in air. The bonding energy as a function of annealing temperature is shown in FIG. 9. The bonding energy reaches the bulk silicon fracture energy (2500 $mJ/m^2$) at 400° C. Bonded pairs of the As implanted silicon wafers that were annealed at 900° C. to fully recrystallize the amorphous layers before bonding have shown the same bonding energy of ~400 $mJ/m^2$ as the conventional HF dipped Si/Si pairs after 400° C. annealing. It is clear that as in the Ar plasma treatment case, the amorphous layers rather than As doping at the bonding interface play a key role in enhancing bonding energy at low temperatures.

Figure 11:
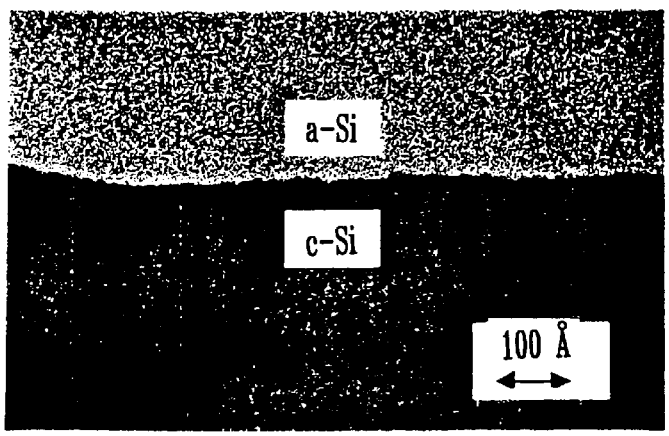
FIG. 11 is a HRTEM (High Resolution TEM) image of an As-implantation induced amorphous layer in a bonding wafer.
Figure 12:
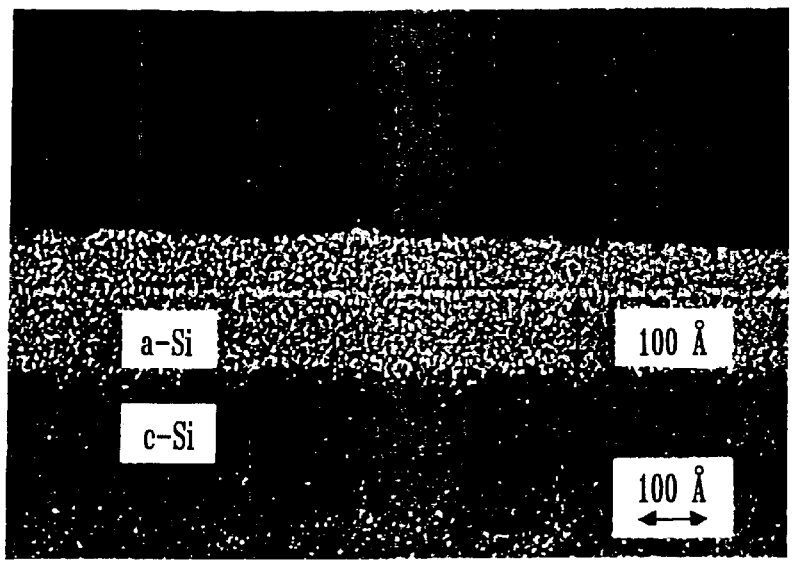
FIG. 12 is a HRTEM image for an As-implanted bonded pair after annealing.

FIGS. 10–12 show TEM images of the As-implanted substrates, and As-implanted bonded substrate pairs. In FIG. 10, a TEM image of bonding interface between the amorphous silicon layers (a-Si/a-Si) that were formed by As implantation is shown. FIG. 11 shows an HRTEM image of the interface between the amorphous silicon and the crystal silicon substrate (a-Si/c-Si). The amorphous layer is reduced to 100 Å in thickness after annealing for 24 hours at 450° C., as shown in FIG. 12.

Figure 13:
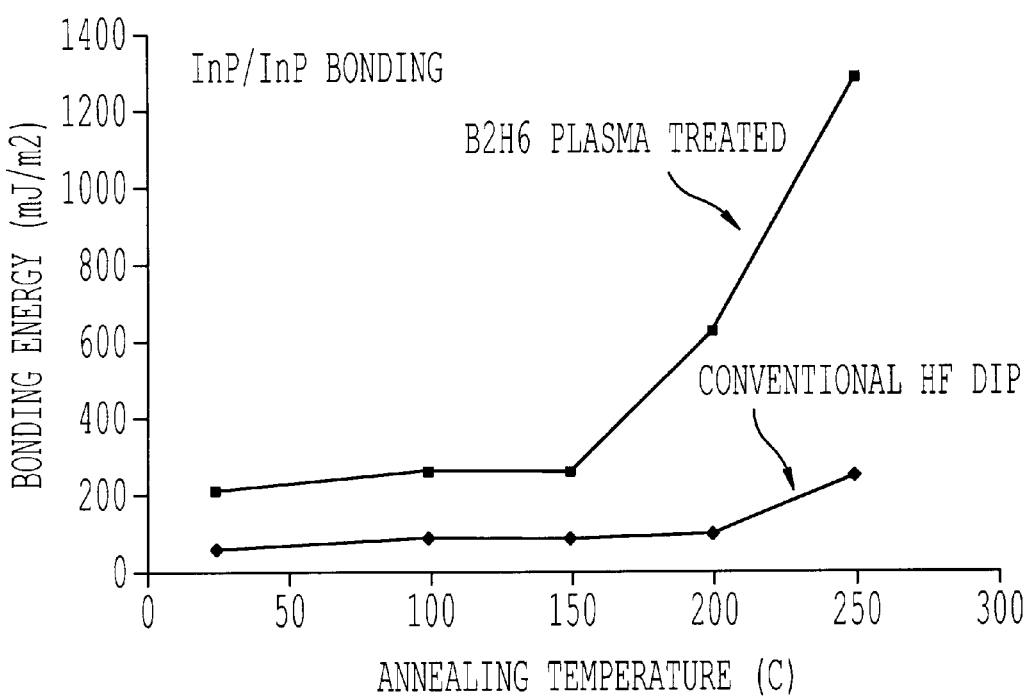
FIG. 13 is a graph depicting bonding energy as a function of annealing temperature of $B_2H_6$ treated InP/InP wafer pairs.

The above methods can be applied to other substrate combinations involving materials such as InP, GaAs, Ge, SiC, etc. Using the $B_2H_6$ plasma treatment process described in the first embodiment to InP/InP epitaxial-like wafer bonding, the bonding energy of the bonded InP/InP pairs reached the (100) InP bulk fracture energy of ~600 $mJ/m^2$ after annealing at 200° C. for 24 h. FIG. 13 shows the bonding energy as a function of annealing temperature of the $B_2H_6$ treated InP/InP wafer pairs. For comparison, the bonding energy as a function of annealing temperature of conventional HF dipped InP/InP pairs is also shown.

Figure 14:
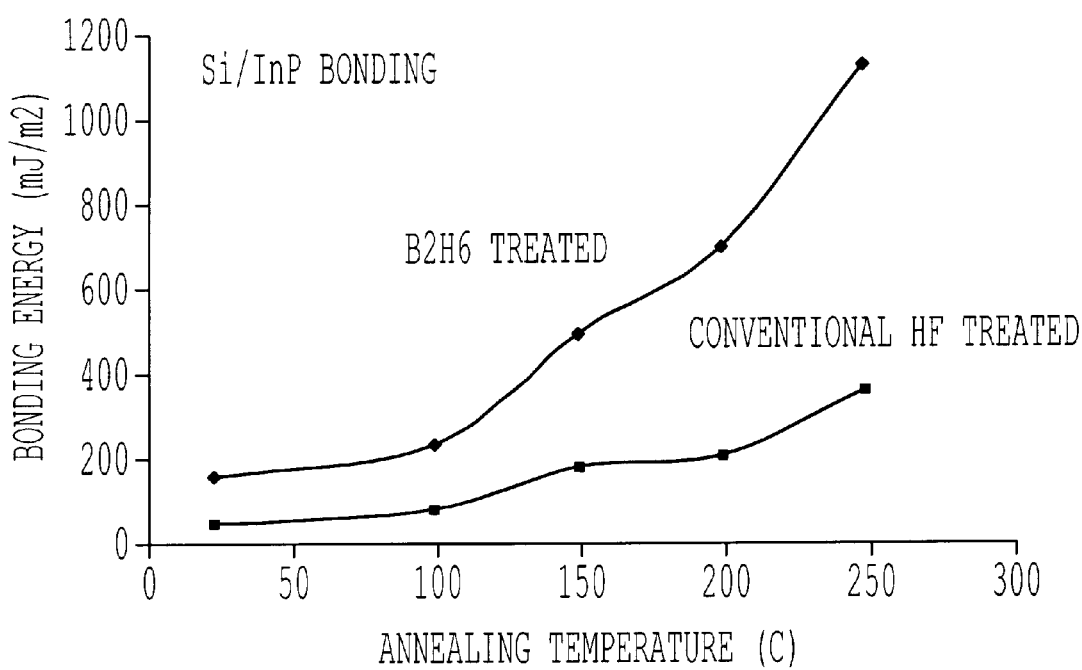
FIG. 14 is a graph depicting bonding energy as a function of annealing temperature of $B_2H_6$ treated Si/InP wafer pairs.
Figure 15A:
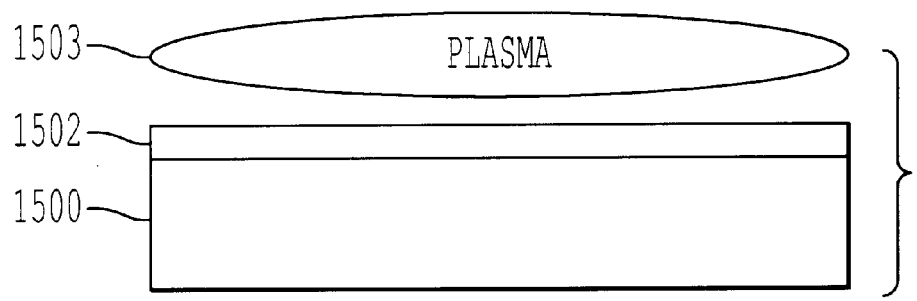
FIGS. 15A–15C are diagrams of a forming a bonded structure according to the invention.
Figure 15B:
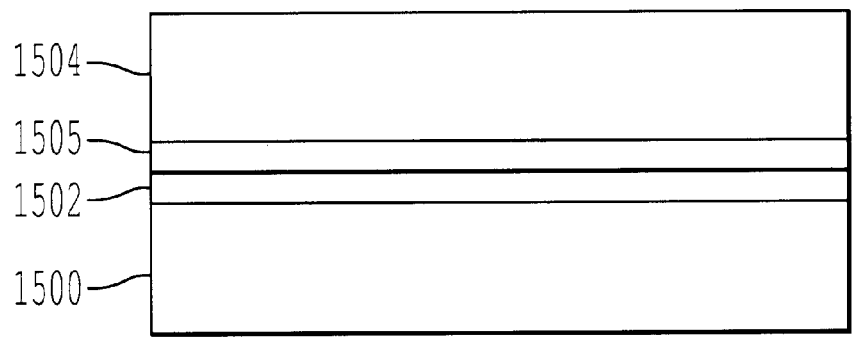
Figure 15C:
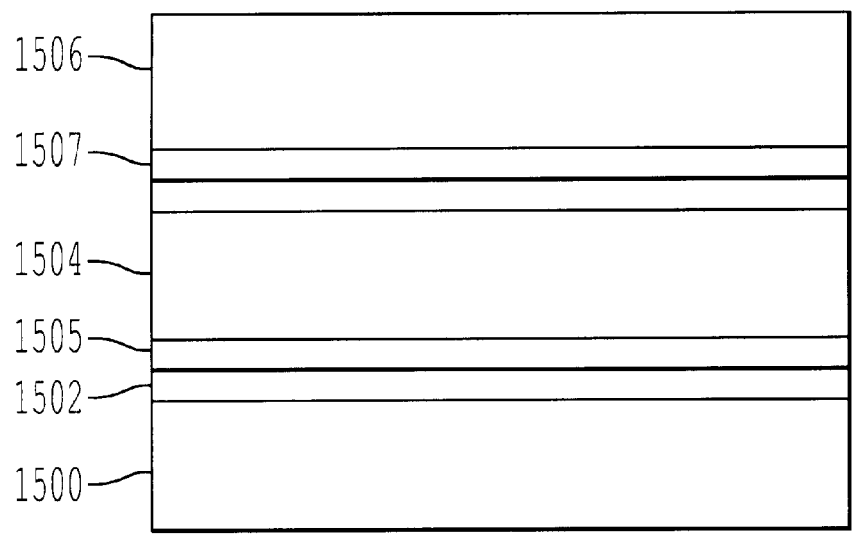
Figure 16A:
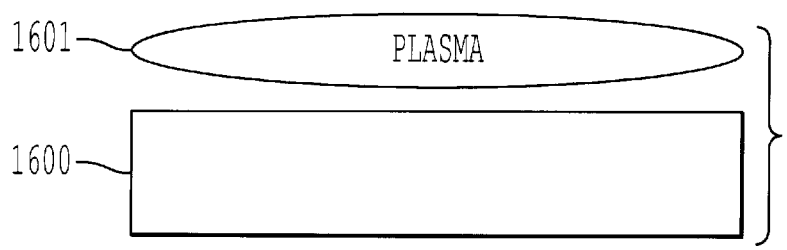
FIGS. 16A–16E are diagrams of a forming a bonded structure according to the invention.
Figure 16B:
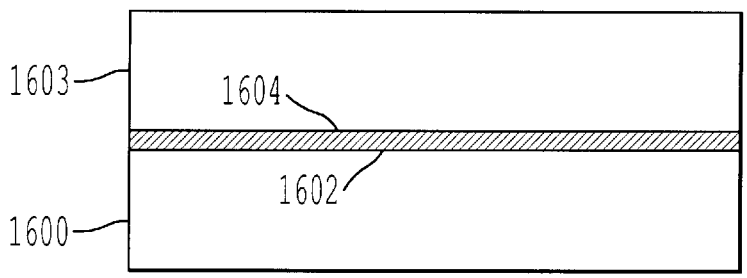
Figure 16C:
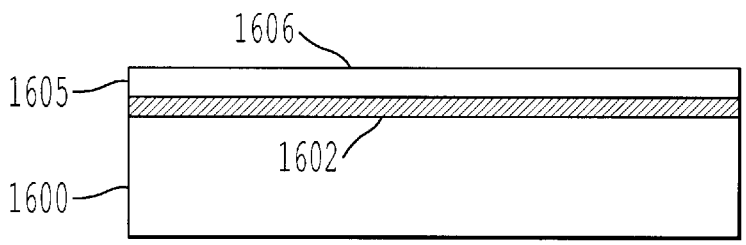
Figure 16D:
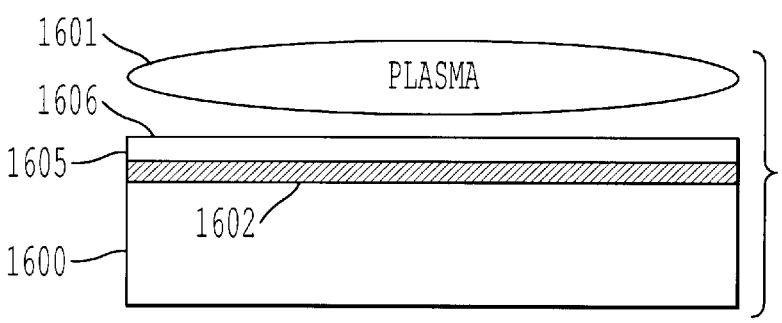
Figure 16E:
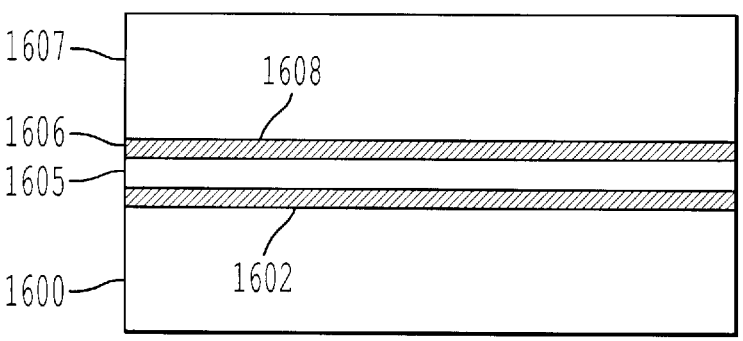

The similar results were obtained for bonding a silicon wafer to an InP wafer. Using the $B_2H_6$ plasma treatment process described in the first embodiment to Si/InP epitaxial-like wafer bonding, the bonding energy of the bonded Si/InP pairs reached the (100) InP bulk fracture energy of ~600 $mJ/m^2$ after annealing at 200° C. for 24 h. FIG. 14 shows the bonding energy as a function of annealing temperature of the $B_2H_6$ treated Si/InP wafer pairs. For comparison, the bonding energy as a function of annealing temperature of conventional HF dipped Si/InP pairs is also shown Two or more wafers having a silicon layer formed on the surface may also be bonded, as shown in FIGS. 15A–15C. Silicon layer 1502 of substrate 1500 is exposed to plasma 1503 in FIG. 15A. A similarly treated surface 1505 of wafer 1504 is placed in contact with surface 1502 and bonded (FIG. 15B). Surface 1505 may also be ion-implanted. The exposed surface of substrate 1504 may also be exposed to a plasma and bonded with treated surface 1507 of wafer 1506 to form a three-substrate bonded structure, as shown in FIG. 15C. These wafers may be processed wafers having devices and/or circuits formed therein with the silicon layer formed after device and/or circuit formation. The silicon layer should be planar, and may be planarized using techniques such as CMP. The silicon layer is treated using a plasma or ion-implantation, as discussed above. This structure preferably used the boron-containing plasma or boron implantation. Also, unique device structures such as double-sided power diodes, pin photodiodes and avalanche photodiodes may be realized. While the above embodiments are directed to substrates, it should be understood that a substrate may be of varying thickness. In other words, thin substrates may be bonded to other substrates, or bonded with two substrates to be between the substrates. A bonded substrate may also be thinned to a desired thickness by lapping or polishing, as discussed above. FIGS. 16A–16E illustrate this. The surface of substrate 1600 is exposed to plasma 1601 to form treated surface 1602 (FIGS. 16A and 16B). Surface 1602 has a surface defect region and may be amorphized. Another substrate 1603 with a treated surface 1604 is bonded to surface 1602 (FIG. 16B). In FIG. 16C, a portion of substrate 1603 is removed by lapping, polishing, etc. to leave portion 1605 with surface 1606. Surface 1606 may then be exposed to a plasma (FIG. 16D) and another wafer 1607 with treated surface 1608 may be bonded to surface 1606 (FIG. 16E). Unique structures where different materials of desired thicknesses may be bonded and formed according to the invention.

Some advantages of the wafer-bonding process of the present invention are that the process utilizes manufacturable steps which bond wafers at room temperature in ambient air and annealed at temperatures no higher than 450° C. to reach an epitaxial-like bond. Pre-annealing at elevated temperatures, external pressure, or high vacuum to achieve a high bonding energy are not required. The process uses common RIE plasma treatments or ion implantation that are economic, convenient and easy to implement.

In addition to the epitaxial-like wafer bonding for materials combination for preparing advanced devices such as pin and avalanche photodiodes, the process shown here can have applications in bonding unique device structures such as bonding back sides of two fully processed power devices to form double-sided power devices, can allow the device layer transfer onto carrier substrates with an epitaxial-like interface, and can be used to transfer device layers to more thermally conductive materials thus enhancing thermal management.

Numerous other modifications and variations of the present invention are possible in light of the above teachings. It is therefore to be understood that within the scope of the appended claims, the present invention may be practiced otherwise than as specifically described herein.

What is claimed as new and desired to be secured by Letters Patents of the United States is:

1. A bonded structure, comprising:
   a first substrate having a first surface, a first nearly-amorphized layer containing one of boron and arsenic formed uniformly over said first surface; and
   a second substrate having a second surface, a second nearly-amorphized layer containing one of boron and arsenic formed uniformly over said second surface;
   said first surface being bonded to said second surface to form a bonded pair of substrates.

2. A structure as recited in claim 1, comprising:
   one of said first and second substrates of said bonded pair having a third surface, said third surface having a nearly-amorphized layer;
   a third substrate having a fourth surface, a fourth nearly-amorphized layer formed in said fourth surface; and
   said third surface bonded to said fourth surface.

3. A structure as recited in claim 1, wherein said first and second substrates are selected from Si, InGaAs, InP, GaAs, Ge and SiC.

4. A structure as recited in claim 1, wherein:
   said first and second substrates each comprises a silicon substrate; and
   said first and second surfaces each comprises a silicon surface.

5. A structure as recited in claim 1, wherein:
   said first and second substrates comprise respective first and second semiconductor devices.

6. A structure as recited in claim 1, wherein:
   said first surface comprises a first silicon surface exposed to a boron-containing plasma; and
   said second surface comprises a second silicon surface exposed to a boron-containing plasma.

7. A structure as recited in claim 1, wherein:
   said first surface comprises a first silicon surface implanted with boron; and
   said second surface comprises a second silicon surface implanted with boron.

8. A structure as recited in claim 1, wherein:
   said first surface comprises a first silicon surface implanted with arsenic; and
   said second surface comprises a second silicon surface implanted with arsenic.

9. A structure as recited in claim 1, comprising:
   at least one of boron-boron and Si covalent bonds formed between said first and second substrates.

10. A structure as recited in claim 1, wherein:
    said first and second amorphous layers are each in the range of a few nm in thickness.

11. A structure as recited in claim 1, wherein said first and second layers each comprise a few monolayers of boron.

12. A structure as recited in claim 1, wherein:
    said first surface comprises an amorphous boron-containing layer; and
    said second surface comprises an amorphous boron-containing layer.

13. A structure as recited in claim 1, wherein:
    said first surface comprises a surface exposed to a boron-containing plasma; and
    said second surface comprises a surface exposed to a boron-containing plasma.

14. A structure as recited in claim 1, wherein:
    said first surface comprises a first surface exposed to an inert gas plasma; and
    said second surface comprises a second surface exposed to an inert gas plasma.

15. A bonded structure, comprising:
    a first substrate having a first surface, substantially all of said first surface being amorphized and containing boron;
    a second substrate having a second surface, substantially all of said second surface being amorphized and containing boron; and
    said first surface being bonded to said second surface to form a bonded pair of substrates.

16. A structure as recited in claim 15, wherein said first and second substrates are selected from Si, InGaAs, InP, GaAs, Ge, SiC.

17. A structure as recited in claim 15, wherein:
    said first surface comprises a first silicon surface exposed to a boron-containing plasma; and
    said second surface comprises a second silicon surface exposed to a boron-containing plasma.

18. A structure as recited in claim 15, wherein:
    said first surface comprises a first silicon surface implanted with boron; and
    said second surface comprises a second silicon surface implanted with boron.

19. A structure as recited in claim 15, comprising:
    forming at least one of boron-boron and Si covalent bonds between said first and second substrates.

20. A structure as recited in claim 15, wherein:
    said amorphized first and second surfaces are each in the range of a few nm in thickness.

21. A structure as recited in claim 15, wherein:
    said amorphized first and second layers each comprises a few monolayers of boron.

22. A bonded structure, comprising:
    a first substrate having a first surface, a first amorphous arsenic-containing layer formed in substantially all of said first surface; and a second substrate having a second surface, a second amorphous arsenic-containing layer formed in substantially all of said second surface;

said first surface being bonded to said second surface to form a bonded pair of substrates.

23. A structure as recited in claim 22, comprising:

one of said first and second substrates of said bonded pair having a third surface, said third surface having an amorphous layer;

a third substrate having a fourth surface, a fourth amorphous layer formed in said fourth surface; and said third surface bonded to said fourth surface.

24. A structure as recited in claim 23, wherein:

said third surface comprises an amorphous arsenic-containing layer; and said fourth surface comprises an amorphous arsenic-containing layer.

25. A structure as recited in claim 22, wherein said first and second substrates are selected from Si, InGaAs, InP, GaAs, Ge and SiC.

26. A structure as recited in claim 22, wherein:

said first and second substrates each comprises a silicon substrate; and said first and second surfaces each comprises an arsenic-containing silicon surface.

27. A structure as recited in claim 22, wherein:

said first surface comprises a substantially planar surface of a first arsenic-containing silicon layer formed on said first substrate; and said second surface comprises a substantially planar surface of a second arsenic-containing silicon layer formed on said second substrate.

28. A structure as recited in claim 22, wherein:

said first surface comprises a first silicon surface implanted with arsenic; and said second surface comprises a second silicon surface implanted with arsenic.

29. A structure as recited in claim 28, comprising:

Si covalent bonds formed between said first and second substrates.

30. A structure as recited in claim 22, comprising:

said first and second surfaces being substantially oxide-free.

31. A structure as recited in claim 22, wherein:

said amorphized first and second surfaces are each in the range of a few nm in thickness.

32. A structure as recited in claim 22, wherein:

said amorphized first and second surfaces each comprises a few monolayers of arsenic.

33. A bonded structure, comprising:

a first substrate having a substantially oxide-free first surface, a substantial portion of said first surface being amorphized and containing one of boron and arsenic; and a second substrate having a substantially oxide-free second surface, a substantial portion of said first surface being amorphized and containing one of boron and arsenic;

said first surface being bonded to said second surface to form a bonded pair of substrates.

34. A structure as recited in claim 33, wherein:

said first substrate comprises one material having said first surface; and said second substrate comprises one material having said second surface.

35. A structure as recited in claim 33, comprising:

one of said first and second substrates of said bonded pair having an amorphized substantially oxide-free third surface;

a third substrate having an amorphized substantially oxide-free fourth surface; and said third surface bonded to said fourth surface.

36. A structure as recited in claim 33, wherein said first and second substrates are selected from Si, InGaAs, InP, GaAs, Ge and SiC.

37. A structure as recited in claim 33, wherein:

said first and second substrates each comprises a silicon substrate; and said first and second surfaces each comprises an amorphized substantially oxide-free silicon surface.

38. A structure as recited in claim 33, wherein:

said first surface comprises a substantially planar surface of a first amorphous substantially oxide-free silicon layer formed on said first substrate; and said second surface comprises a substantially planar surface of a second amorphous substantially oxide-free silicon layer formed on said second substrate.

39. A structure as recited in claim 33, wherein:

said first surface comprises a surface exposed to a boron-containing plasma; and said second surface comprises a surface exposed to a boron-containing plasma.

40. A structure as recited in claim 33, wherein:

said first surface comprises an ion-implanted surface; and said second surface comprises an ion-implanted surface.

41. A structure as recited in claim 33, wherein:

said first surface comprises a surface ion-implanted with one of boron and arsenic; and said second surface comprises a surface ion-implanted with one of boron and arsenic.

42. A structure as recited in claim 41, comprising:

boron-boron formed between said first and second substrates.

43. A bonded structure, comprising:

a first substrate having a first surface with an amorphized first surface region extending only one to a few monolayers into said first substrate; and a second substrate having a second surface an amorphized second surface region extending only one to a few monolayers into said second substrate; and said first surface being bonded to said second surface to form a bonded pair of substrates.

44. A structure as recited in claim 43, wherein:

said amorphized first and second surface regions are each in the range of a few nm in thickness.

45. A structure as recited in claim 43, wherein:

said first and second surface regions each comprise at least one region extending over a substantial portion of a surface of said first and second substrates, respectively.

46. A structure as recited in claim 43, comprising:

one of said first and second substrates of said bonded pair having a third surface with an amorphized third surface region;

a third substrate having a fourth surface with an amorphized fourth surface region; and said third surface bonded to said fourth surface.

47. A structure as recited in claim 43, wherein said first and second substrates are selected from Si, InGaAs, InP, GaAs, Ge and SiC.

48. A structure as recited in claim 43, wherein:

said first and second substrates each comprises a silicon substrate; and said first and second surfaces each comprises a silicon surface.

49. A structure as recited in claim 43, wherein:

said first surface comprises a surface exposed to a boron-containing plasma; and said second surface comprises a surface exposed to a boron-containing plasma.

50. A structure as recited in claim 43, wherein:

said first surface comprises an ion-implanted surface; and said second surface comprises an ion-implanted surface.

51. A structure as recited in claim 43, wherein:

said first surface comprises a surface implanted with one of boron and arsenic; and said second surface comprises a second surface implanted with one of boron and arsenic.

52. A structure as recited in claim 50, comprising:

boron-boron covalent bonds formed between said first and second substrates.

53. A bonded structure, comprising:

a first substrate of substantially one first material amorphized substantially only in a first surface of said first material and containing one of boron and arsenic; and a second substrate of substantially one second material amorphized substantially only in a second surface of said second material and containing one of boron and arsenic;

said first surface being bonded to said second surface to form a bonded pair of substrates.

54. A structure as recited in claim 53, comprising:

one of said first and second substrates of said bonded pair being amorphized only in said first surface and in a third surface of said first material;

a third substrate of substantially one third material amorphized only in a third surface of said third material; and said third surface bonded to said fourth surface.

55. A structure as recited in claim 53, wherein said first and second substrates are selected from Si, InGaAs, InP, GaAs, Ge and SiC.

56. A structure as recited in claim 53, wherein:

said first and second substrates each comprises a silicon substrate; and said first and second surfaces each comprises a silicon surface.

57. A structure as recited in claim 53, wherein:

said first surface comprises a substantially planar surface of a first silicon layer formed on said first device; and said second surface comprises a substantially planar surface of a second silicon layer formed on said second device.

58. A structure as recited in claim 53, wherein:

said first surface comprises a surface exposed to a boron-containing plasma; and said second surface comprises a surface exposed to a boron-containing plasma.

59. A structure as recited in claim 53, wherein:

said first surface comprises a surface implanted with one of boron and arsenic; and said second surface comprises a surface implanted with one of boron and arsenic.

60. A structure as recited in claim 59, comprising:

boron-boron covalent bonds formed between said first and second substrates.

* * * * *

(12) INTER PARTES REVIEW CERTIFICATE (130th)
United States Patent (10) Number: US 6,563,133 K1
Tong (45) Certificate Issued: May 12, 2016

(54) METHOD OF EPITAXIAL-LIKE WAFER BONDING AT LOW TEMPERATURE AND BONDED STRUCTURE

(75) Inventor: Qin-Yi Tong

(73) Assignee: ZIPTRONIX, INC.

Trial Number:

IPR2014-00114 filed Nov. 1, 2013

Petitioners: Taiwan Semiconductor Manufacturing Company, LTD.; TSMC North America Corporation Patent Owner: ZIPTRONIX, INC.

Inter Partes Review Certificate for:

Patent No.: 6,563,133
Issued: May 13, 2003
Appl. No.: 09/635,272
Filed: Aug. 9, 2000

The results of IPR2014-00114 are reflected in this inter partes review certificate under 35 U.S.C. 318(b).

INTER PARTES REVIEW CERTIFICATE
U.S. Patent 6,563,133 K1
Trial No. IPR2014-00114
Certificate Issued May 12, 2016

AS A RESULT OF THE INTER PARTES REVIEW PROCEEDING, IT HAS BEEN DETERMINED THAT:

Claims 1-14 and 53-60 are cancelled.

\* \* \* \* \*